(12) United States Patent
Reed et al.

(10) Patent No.: US 7,956,369 B2
(45) Date of Patent: Jun. 7, 2011

(54) LIGHT EMITTING DIODE

(75) Inventors: Meredith L. Reed, Perry Hall, MD (US); Michael Wraback, Germantown, MD (US); Paul Shen, Potomac, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 158 days.

(21) Appl. No.: 12/437,170

(22) Filed: May 7, 2009

(65) Prior Publication Data
US 2010/0187550 A1 Jul. 29, 2010

Related U.S. Application Data

(60) Provisional application No. 61/051,219, filed on May 7, 2008.

(51) Int. Cl.
*H01L 33/02* (2010.01)
(52) U.S. Cl. ............... 257/94; 257/13; 257/E33.013
(58) Field of Classification Search ............ 257/94, 257/E33.003, E33.005, E33.023, E33.025, 257/E33.027, E33.028, E33.032, E33.034, 257/13
See application file for complete search history.

(56) References Cited

U.S. PATENT DOCUMENTS
6,515,313 B1 2/2003 Ibbetson et al.
7,115,906 B2 10/2006 Lai et al.
2002/0084467 A1* 7/2002 Krames et al. ............ 257/103
2004/0227150 A1* 11/2004 Nakahara .................. 257/103
2008/0241982 A1* 10/2008 Lee et al. ................... 438/47

OTHER PUBLICATIONS

J. Piprek, et al., "Simulation and Optimization of 420nmInGaN/GaN Laser Diode," Physics and Simulation of Optoelectronic Devices VIII, ed. R. Binder, P. Blood & M. Osinski; SPIE Proceedings 3944, 2000.
Reed, M., et al., Abstract entitled HVPE-Grown n-InGaN/p-GaN Single Heterostructure LED with p-Side down, dated Apr. 10, 2007, from website http://www.cleoconference.org.
A. Bykhovski, et al, "The Influence of the Strain-Induced Electric Field on the charge distribution in GaN-AIN-GaN Structure," J. Appl. Phys. 74(11), 6734 (1993).
T. Takeuchi, et al. "Quantum-Confined Stark Effect due to Piezoelectric Fields in GaInN Strained Quantum Wells," Jpn, J. Appl. Phys., Part 2, 36, L382 (1997).

(Continued)

*Primary Examiner* — Victor Mandala
*Assistant Examiner* — Scott Stowe
(74) *Attorney, Agent, or Firm* — Lawrence E. Anderson

(57) ABSTRACT

A light emitting device comprising: a polar template; a p-type layer grown thereon; the p-type layer having a first polarization vector having a first projection relative to a growth direction; an n-type layer grown on the p-type layer; the n-type layer having a second polarization vector that is larger than the first polarization vector; the n-type layer and p-type layer forming an interface. Another preferred embodiment light emitting device comprises a polar template; an n-type layer grown on the template; the n-type layer having a first polarization vector having a first projection relative to a growth direction; a p-type layer grown on the n-type layer having a second polarization vector that is larger than the first polarization vector. In both embodiments, the first polarization vector in the p-layer and second polarization vector in the n-layer create discontinuity at the interface resulting in a negative charge appearing at the interface.

21 Claims, 32 Drawing Sheets p – up device

OTHER PUBLICATIONS

P. Kozodov, et al. "Enhanced Mg doping efficiency in Al0.2Ga0.8N/GaN superlattices" Appl. Phys. Lett. 74, 3681 (1999).

K. Iso, et al. High Brightness Blue InGaN/GaN Light Emitting Diode on Nonpolar m-plane Bulk GaN Substrate, Jpn. J. App. Phys., 46(40), pp. L960-L962 published on-line Oct. 12, 2007.

M. D. Craven, et al,"Well-width dependence of photoluminescence emission from a-plane GaNŌAlGaN multiple quantum wells," Appl. Phys. Lett. 84, 496 (2004).

H. M. Ng, "Molecular-beam epitaxy of GaN/AlxGa1—xN multiple quantum wells on R-plane (102) sapphire substrates," Appl. Phys. Lett. 80, 4369 (2002).

P. Waltereit et al., "Nitride semiconductors free of electrostatic fields for efficient white light-emitting diodes," Nature 406, 865 (2000).

Lan, Wen-How "Wavelength Shift of Gallium Nitride Light Emitting Diode With p-Down Structure" IEEE Transactions on Electron Devices, vol. 52, No. 6, Jun. 2005, page.

Okamoto, et al., "Dislocation-Free m-Plane InGaN/GaN Light-Emitting Diodes on m-Plane GaN Single Crystals," Jpn. J. Appl. Phys. 45 (2006) pp. L1197-L1199.

Su, Y.K. "InGaN/GaN Light Emitting Diodes With a p-Down Structure," IEEE Transactions on Electron Devices, vol. 49, No. 8, Aug. 2002, p. 1361.

H. C. Casey, et al. "Radiative Tunneling in GaAs Abrupt Asymmetrical Junctions," vol. 94, No. 6, J. Appl. Phys. 40, 241h (1969).

M. Kim, et al., "Origin of efficiency droop in GaN-based light-emitting diodes," Appl. Phys. Lett., 91, 183507 (2007).

N. F. Gardner,et al. "Blue-emitting InGaN/GaN double-heterostructure light-emitting," Appl. Phys. Lett., 91, 243506 (2007).

M.F. Schubert, et al. "Effect of dislocation density on efficiency droop in GaInN/GaN light-emitting diodes," Appl. Phys. Lett. 91, 231114 (2007).

Y.C. Shen, et al "Auger recombination in InGaN measured by photoluminescence"Appl. Phys. Lett. 91, 141101 (2007).

Nakamura, S. and Fasol, G., 2000, The Blue Laser Diode, Springer, Berlin, pp. 79-91, 102-127, 177-315.

Krames, M.R., et al."High-Power III-Nitride Emitters for Solid-State Lighting" Physica Status Solidi (a), 192(2), 237 (2002).

Bykhovski, A., et al. "The influence of the strain-induced electric field on the charge distribution in GaN-AlN-GaN structure," J. Appl. Phys. 74, 6734 (1993).

Takeuchi, T., "Quantum-Confined Stark Effect due to Piezoelectric Fields in GaInN Strained Quantum Wells," Jpn, J. Appl. Phys., Part 2, 36, L382 (1997).

Nakamura, Shuji, Zn-doped InGaN Growth and InGaN/AlGaN DOuble-heterostructure Blue-light-emitting Diodes, Journal of Crystal Growth 145 (1994). 911-917.

Ibbetson, J. P., et al. "Polarization effects, surface states, and the source of electrons in AlGaN/GaN heterostructure field effect transistors," Appl. Phys. Letts. 77, 250 (2000).

Park, S-H. et al. "Spontaneous polarization effects in wurtzite GaN/AlGaN quantum wells and comparison with experiment," 2000 Appl. Phys. Letts. 76, 1981.

Hsueh et al. "Effect of Cl2 /Ar dry etching on p-GaN with Ni/Au metallization characterization" Applied Physics Letters 87, 252107 2005 87, 252107-1.

Gardner, N. F., "Blue-emitting InGaN-GaN double-heterostructure light-emitting diodes reaching maximum quantum efficiency above 200 A/cm2" (2007) Appl. Phys. Lett. 91, 243506.

Zhang Y., and Singh, J., "Charge control and mobility studies for an AlGaN/GaN high electron mobility transistor," J. Appl. Phys. 85, 587 (1998).

Vurgaftman, I. and Meyer,"Band parameters for nitrogen-containing semiconductors," (2003) J. Appl. Phys. Rev. 94, 3675.

Wu, J. "Small band gap bowing in In1ÀxGaxN alloys" Applied Physics Letters vol. 80, No. 25 Jun. 24, 2002, pp. 4741-4743.

Reed, et al. "Device Challenges for Making a p-Side Down HVPE-Grown n-InGaN/p-GaN Single Heterostructure LED," Electrochemical Society Trans. vol. 11 Issue 5, pp. 171-174 Oct. 2007.

Schubert, E.F. "Light Emitting Diodes," p. 82, Cambridge, New York (2006).

* cited by examiner

Group V and Group VI-polar Semi-polar template

Group II and Group III-polar Semipolar template

Group II and Group III-Polar Template

Group V and VI-Polar Template

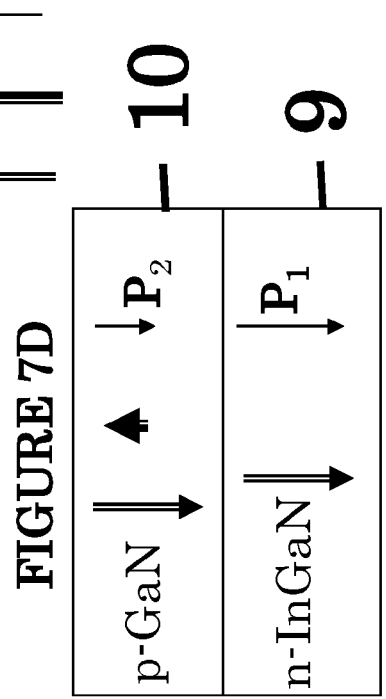
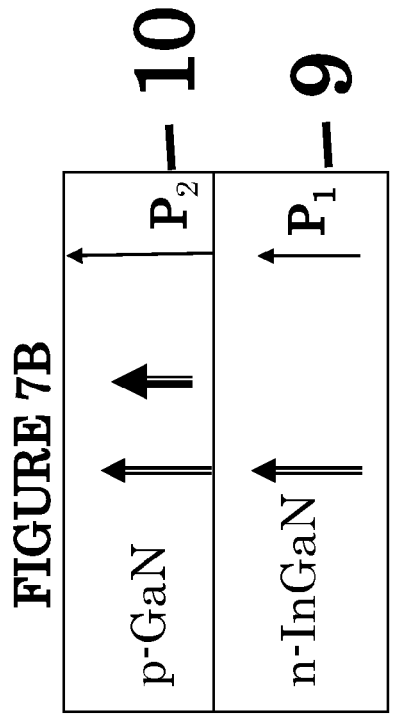
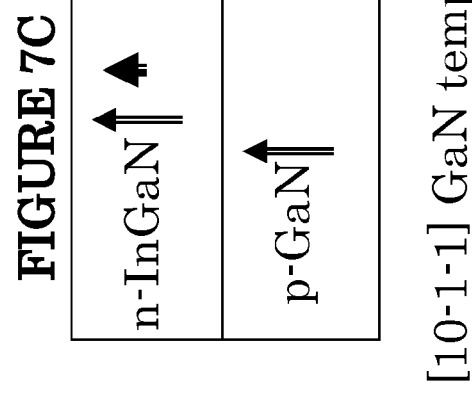
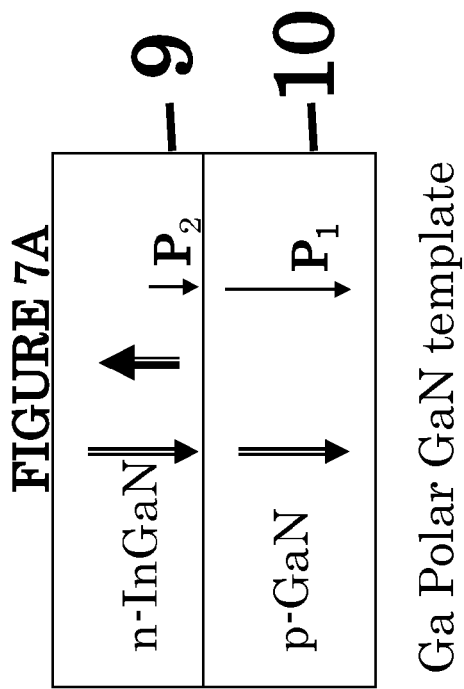

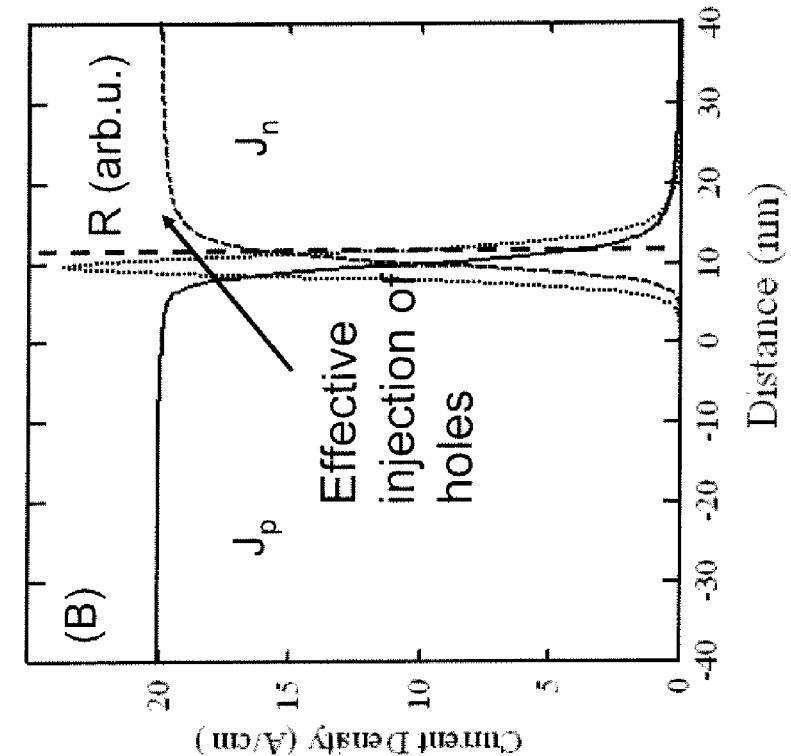
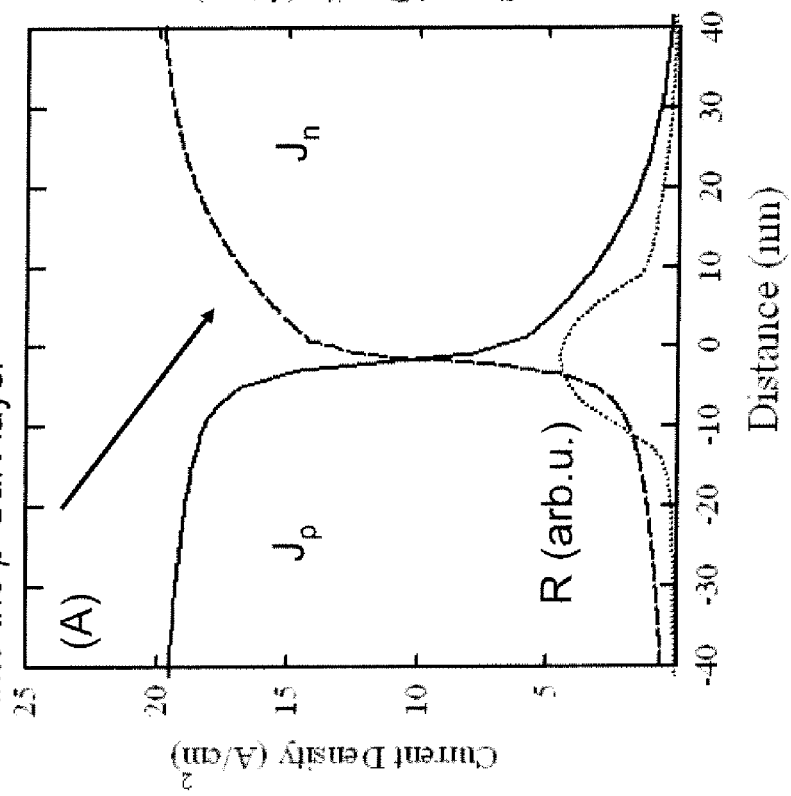
FIGURE 15A
FIGURE 15B

FIGURE 18 EXPERIMENTAL RESULTS

LIGHT EMITTING DIODE

CROSS-REFERENCE TO RELATED APPLICATIONS

This application claims priority of U.S. Provisional Patent Application Ser. No. 61/051,219 filed May 7, 2008, which is incorporated herein by reference.

GOVERNMENT INTEREST

The invention described herein may be manufactured, used, and/or licensed by or for the United States Government.

FIELD OF INVENTION

The invention generally relates to semiconductor light emitters, and in particular, highly efficient III-nitride semiconductors for use in light emitting diodes (LEDs) and/or lasers.

DESCRIPTION OF THE PRIOR ART

A semiconductor's ability to conduct can be modified through the process of "doping" during the growth process. Growth of conventional semiconductor materials can be performed via a variety of different growth processes and is dependent upon the type of material being grown. These growth processes can include, but is not limited to: metal-organic chemical vapor deposition, molecular beam epitaxy, pulsed laser ablation, ammono thermal method, etc. In doped semiconductors, p-type and n-type, the Fermi level is shifted by the dopants, illustrated by their band gaps. The Fermi function f(E) gives the probability that a given available electron energy state will be occupied at a given temperature. The Fermi function is defined as:

$$f(E) = \frac{1}{e^{(E-E_\varphi)/kT} + 1}$$

Where E is the band gap of the material, $E_F$ is the Fermi energy in the band gap, k is Boltzmann's constant=$8.6 \times 10^{-5}$ eV/K, and T is the temperature in Kelvin, The Fermi function dictates that at ordinary temperatures, most of the levels up to the Fermi level $E_F$ are filled, and relatively few electrons have energies above the Fermi level.

High efficiency III-nitride LEDs and lasers is difficult to achieve due to many well-known problems. Existing state of the art III-nitride light emitters have the wurtzite crystal structure, grown in the <0001> direction, are Ga-polar where the p-GaN layer is grown on top of the n-GaN layer, which shows a Ga-polar p-up device. As used herein, p-up describes the general growth sequence where a template layer 2 is grown on top of a substrate 1 then a p-layer 4 is grown on top of an n-layer 3; and p-down describes the general growth sequence where the a template layer 2 is grown on top of a substrate and a n-layer 3 is grown on top of a p-layer 4 as shown in FIGS. 1A and 1B, respectively. One problem is the large internal electric field associated with the spontaneous/piezoelectric polarization charges. This strong internal electric field separates the injected electrons from the holes, resulting in a lower radiative recombination rate. Another problem with nitride LEDs or lasers is the small conduction band offset in the InGaN multiple quantum wells (MQW), resulting in vertical electron leakage into the p-side GaN (AlGaN) waveguide layer. While these phenomena occur in both p-up and p-down Ga-polar structures, the positive polarization charge near the p-cladding layer in a conventional p-up Ga-polar device combined with a small conduction band offset in the InGaN/GaN system further leads to electron overshoot, and thus a decrease in the efficiency of visible and near-ultraviolet light emitting devices as shown in FIG. 2. To reduce the electron overshoot, an electron-blocking layer (EBL), with a larger band gap must be used as shown in FIG. 3A, which shows a template 2, grown on a substrate 1 where the growth sequence continues as follows: a n-GaN layer 5, a n-InGaN/GaN MQW 6, a p-AlGan EBL 7 and a p-GaN layer 8.

The larger band gap electron-blocking layer, however, increases the polarization field in the quantum well LED structure, creating a potential spike in the valence band that blocks the injection of holes while only partly ameliorating the electron leakage, as the strong electric field in the QW barriers effectively lowers the electron barrier. To circumvent these polarization effects in LEDs and lasers, devices grown on non-polar or semi-polar substrates have been realized and polarization-balanced quaternary InAlGaN devices on c-plane substrates have been proposed. This problem has existed since the beginning of the development of III-nitride LEDs, and the spontaneous/piezoelectric polarization charges are always considered as a detrimental effect.

As shown in the band diagram of FIG. 2, positive spontaneous and piezoelectric polarization charge result in a reduced effective conduction band barrier resulting in large electron overshoot (allowance of carrier leakage to the p-layer) and necessitating the introduction of the commonly employed electron blocking layer (such as AlGaN electron blocking layer (EBL) structure. The incorporation of the larger band gap EBL increases the polarization field in the QW and effectively inhibits the injection of holes. To circumvent the polarization effects in LEDs and lasers, devices have been grown on non-polar m-plane and a-plane substrates and on semi-polar substrates. In conventional devices, spontaneous/piezoelectric polarization charges create a strong electric field that separates the injected electrons from the holes, resulting in a lower radiative recombination rate. Another crucial issue with conventional nitride LEDs or lasers is the small conduction band offset in the InGaN multiple quantum wells (MQW), resulting in vertical electron leakage into the p-side GaN (AlGaN) waveguide layer. FIG. 3B is a graphical illustration of the band gaps in conventional p-up Ga-polar III-Nitride light emitting devices. Furthermore, the positive polarization charges at the interface of the electron blocking layer and the active region, which block the injection of holes into the active region, resulting in lack of holes there. This problem has existed since the beginning of the development of III-nitride LEDs, and the spontaneous/piezoelectric polarization charges are generally considered as a detrimental effect.

In general, the polarization effect on InGaN/GaN and GaN/AlGaN quantum well light emitting diodes (LEDs) or lasers is considered detrimental for conventional applications. The electric field inside the quantum well generated by polarization sheet charges of opposite sign on either side of the quantum well reduces the emission efficiency in several ways. First, the strong electric field leads to a spatial separation of electrons and holes, which lowers the probability of radiative recombination and thus lowers the emission efficiency. Second, the strong localization due to the large field reduces the effective barrier height for electrons and holes, which promotes the carriers' escape from the quantum well. The above two considerations are applicable to both p-up and p-down Ga-polar devices. However, in a conventional p-up Ga-polar device, the positive polarization charge near the p-cladding layer combined with a small conduction band offset in the InGaN/GaN system further leads to electron overshoot, and thus decreases the injection efficiency. To reduce the electron overshoot, an electron-blocking layer with a larger band gap must be used. The large band gap electron blocking layer, however, increases the polarization field in the quantum well and creates a potential spike in the valence band, blocking the injection of holes.

Shown in FIG. 3B, and as reported by M-H. Kim, et al., Appl. Phys. Letter, 91, 183507 (2007), the polarization effect on InGaN/GaN QW LED is detrimental for conventional p-up and p-down devices, as the strong electric field in the quantum well (QW) lowers the probability of radiative recombination and promotes the carriers' escape from the QW. The strong electric field in the QW lowers the probability of radiative recombination and promotes the carriers' escape from the QW. For p-up device the strong electric field in the barrier effectively lowers EBL and leads to a large electron overshoot. The large $E_g$ of the electron blocking layer (EBL) increases polarization in the quantum well (QW), creating a potential spike in valence band; thereby reducing hole injection efficiency.

Several methods have been used to improve the performance of III-nitride LEDs. One approach utilizes multiple quantum wells to confine the electrons and holes inside the well, thus increasing its radiative recombination rate. Most of the commercially available III-nitride LEDs are based on a quantum well structure, since this approach has shown success. However, this approach introduces other obstacles that inhibit device efficiency. Due to the large electric field in the quantum well, the benefit of confining the electrons and holes close together can only be achieved with very thin quantum well. The positive polarization charge near the p-cladding layer combined with a small conduction band offset in the InGaN/GaN system further leads to electron overshoot, and thus decreases the injection efficiency. To reduce the electron overshoot, an electron-blocking layer with a larger band gap must be used, which is typically AlGaN. The large band gap electron blocking layer, however, increases the polarization field in the quantum well and creates a potential spike in the valence band, blocking the injection of holes. Utilization of AlGaN increases the turn on voltage resulting in lower conversion efficiency for these devices. In addition, use of high Al composition in AlGaN is not desirable from growth and fabrication consideration.

In a publication by Piprek, et. al., entitled *Simulation and Optimization of 420 nm In GaN/GaN Laser Diodes*, SPIE Proc. 3944, 2000, the authors, using self-consistent laser simulation, analyzed the performance of nitride laser diodes grown on sapphire. The carrier distribution among quantum wells was found to be strongly non-uniform leading to a parasitic (absorbing) quantum well. The influence of defect recombination, vertical carrier leakage and lateral current spreading was investigated. The reduction of such carrier losses was deemed important to achieve lower threshold currents and less self-heating. According to Piprek, et. al, elimination of the parasitic quantum well was shown to substantially enhance the device performance.

U.S. Pat. No. 6,515,313 to Ibbetson, et al., hereby incorporated by reference, proposed several methods to reduce polarization induced charges in a MQW LED structure, including reducing difference in the material compositions of adjacent crystal layers, grading one or more layers to generate space charges and quasi-fields that oppose polarization-induced charges, incorporating various impurities into the semiconductor that ionize into a charge state opposite to the polarization induced charges, inverting the sequence of charged atomic layers, inverting the growth sequence of n- and p-type layers in the device, employing a multilayer emission system instead of a uniform active region and/or changing the in-plane lattice constant of the material. These methods are limited to quantum well structures and only address the issues of the confinement of electron and holes. It does not address the vertical electron leakage and the injection of holes issues.

An object of the present invention is to reduce the adverse effect of polarization-induced charge and make it beneficial to the performance of a light emitting device. Moreover, LED prior art devices commonly comprise a second heterojunction. With present invention; a second heterojunction is not necessary.

SUMMARY OF THE INVENTION

A preferred embodiment of the present invention provides a new single heterojunction III-nitride design for LEDs and other light emitting crystal structures, with either p-down Ga-polar or p-up N-polar. A preferred embodiment of the present invention comprises a heterojunction structure without quantum wells. The spontaneous/piezoelectric polarization charge at the interface of the heterojunction is negative resulting in an increase in the electron barrier, substantially eliminates the hole barrier. A 2D hole-gas forms near the interface, which significantly enhances the recombination of electrons with holes. The present invention exhibits a higher current to light conversion efficiency than conventional devices. In addition, no electron blocking layer is required resulting in a lower turn on voltage, higher conversion efficiency, and longer device lifetime due to lower thermal load. The band gap is wider in the p-type layer so that the recombination occurs in the n-type layer. In one preferred embodiment, the negative polarization charge is obtained by utilization of p-type layer having a spontaneous polarization charge less than the n-type layer spontaneous polarization charge. In addition, lattice mismatching creates a piezoelectric polarization charge. The present invention is not limited to any particular material composition and a variety of polar semiconductor materials may be selected.

BRIEF DESCRIPTION OF THE DRAWINGS

FIG. 7A illustrates the polarization vectors for a single heterostructure grown on a Ga-polar GaN template grown along the [0001] wurtzite direction, where a p-GaN layer (element 10) is grown on the Ga-polar surface, then a n-InGaN layer (element 9) is grown on a p-GaN layer 10, representative of a p-down device. The p-GaN 10 has the first polarization vector and the n-InGaN layer 9 has the second polarization vector, where the projection of second polarization vector to the growth direction is larger than the projection of the first polarization vector to the growth direction, when the n-InGaN layer 9 is grown on the p-GaN layer 10, results in a negative polarization charge at the heterointerface.

FIG. 7B illustrates the polarization vectors for a single heterostructure grown on a N-polar GaN template grown along the [–0001] wurtzite direction, where a n-InGaN layer (element 9) is grown on the N-polar surface, then a p-GaN layer (element 10) is grown on a n-InGaN layer 9, representative of a p-up device. The n-InGaN 9 has the first polarization vector and the p-GaN layer 10 has the second polarization vector, where the projection of second polarization vector to the growth direction is larger than the projection of the first polarization vector to the growth direction, when the p-GaN layer 10 is grown on the n-InGaN layer 9, results in a negative polarization charge at the heterointerface.

FIG. 7C illustrate the polarization vectors of a Ga-polar device grown along the [10-1-1] wurtzite direction, where a p-GaN layer 10 is grown on the Ga-polar surface, then a n-InGaN layer 9 is grown on the n-InGaN layer 10. The p-GaN 10 has the first polarization vector and the n-InGaN layer 9 has the second polarization vector, where the projection of second polarization vector to the growth direction is larger than the projection of the first polarization vector to the growth direction, when the n-InGaN layer 9 is grown on the p-GaN layer 10, results in a negative polarization charge at the heterointerface.

FIG. 7D illustrate the polarization vectors for a Ga-polar device grown along the [11-22] wurtzite direction, where a n-InGaN layer (element 9) is grown on the Ga-polar surface, then a p-GaN 10 is grown on top of a n-InGaN layer 9. The direction of the piezoelectric polarization at the n-InGaN/p-GaN heterointerface inverses as a result of strain along the [11-22], resulting in a negative polarization charge at the heterointerface. The n-InGaN 9 has the first polarization vector and the p-GaN layer 10 has the second polarization vector, where the projection of second polarization vector to the growth direction is larger than the projection of the first polarization vector to the growth direction, when the p-GaN layer 10 is grown on the n-InGaN layer 9, results in a negative polarization charge at the heterointerface.

FIG. 10 illustrates the energy levels at the p-n junction for the energy levels and band gaps for the n-layer and the p-layer. FIG. 10 depicts the presence of 2D hole gas in p-n heterojunctions with polarization charge larger than the maximum space charge.

FIG. 12 graphically depicts the maximum space charge per unit area as a function of doping.

FIG. 15A shows the current density and radiative recombination rate at forward current density of 20 A/cm$^2$ for p-up device.

FIG. 15B shows the current density and radiative recombination rate at forward current density of 20A/cm$^2$ for p-down device.

DESCRIPTION OF THE PREFERRED EMBODIMENTS

Figure 1A:
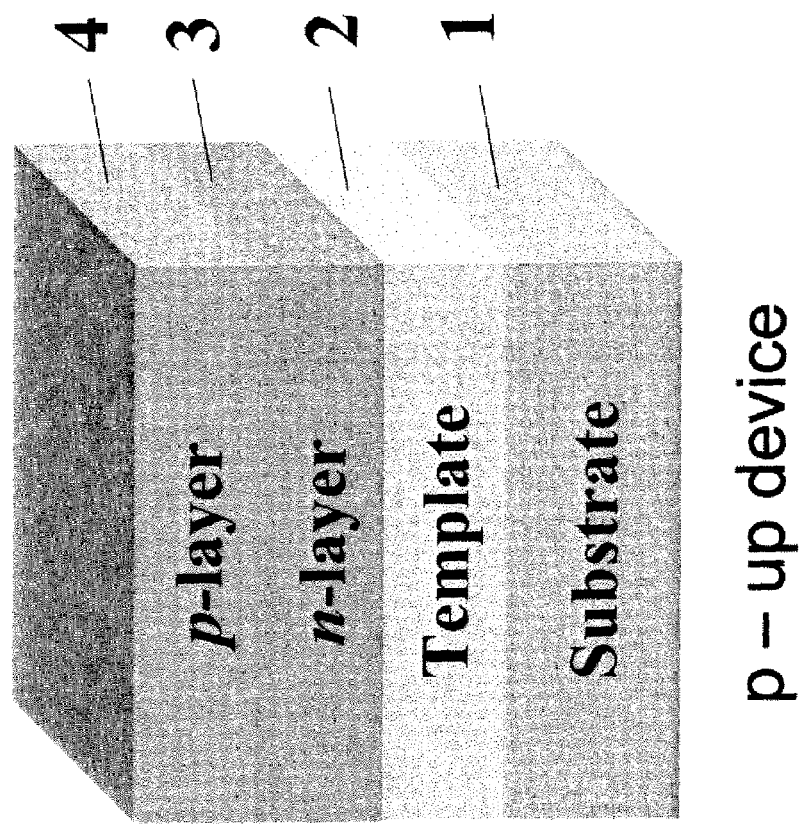
FIG. 1A shows a p-up device structure, and describes the general growth sequence where the p-layer is grown on top of the n-layer.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skilled in the art to practice the embodiments of the invention. Accordingly, the examples should not be construed as limiting the scope of the embodiments of the invention.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second layers in an n-type layer, these terms are only used to distinguish one element, component, region, layer or section from another layer. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

As used herein, the terminology "polarity" refers to a compound crystal in which more than one element can be closest to the surface or interface. For example, GaN can have two surfaces with different polarities, a Ga-polar surface and an N-polar surface as shown in FIGS. 4A and 4B. A Ga-polar surface generally refers to a surface terminating on a layer of Ga atoms, each of which has one unoccupied bond normal to the surface. Each surface Ga atom is bonded to three N atoms in the direction away from the surface.

Figure 4:
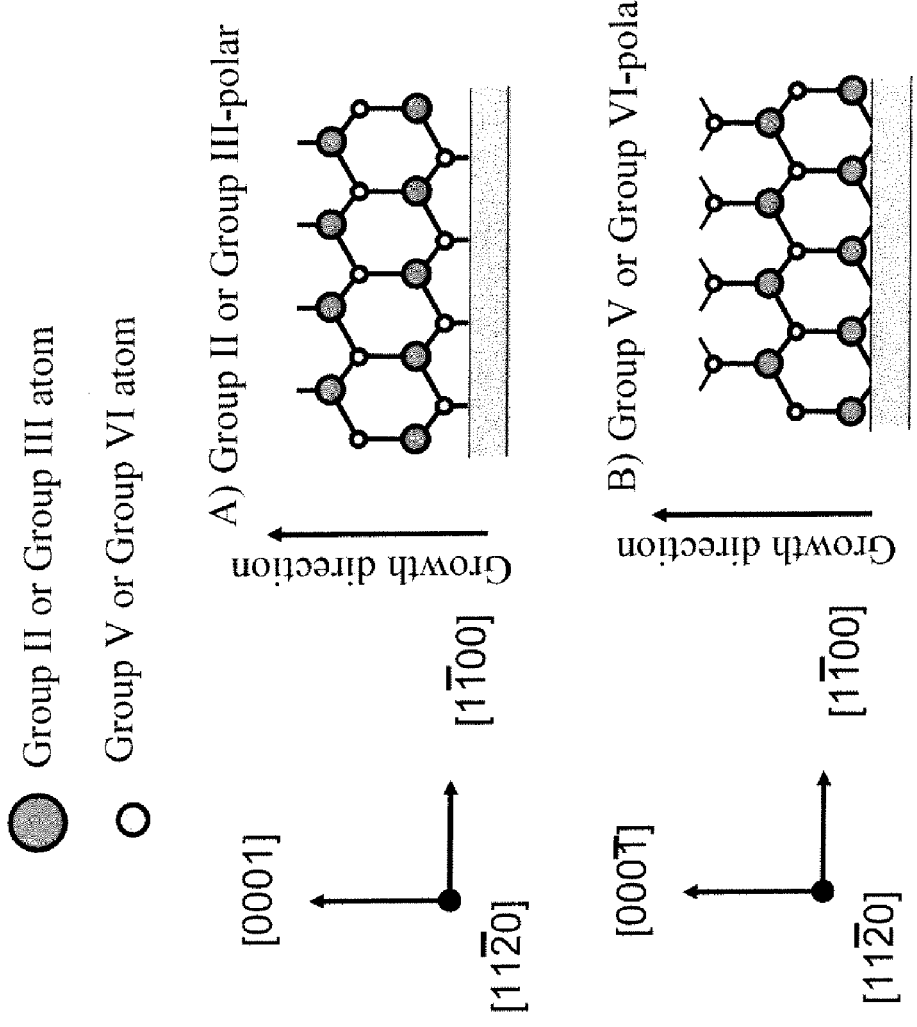
FIG. 4A is a graphical representation of a Group II-polar and Group III-polar surface with respect to the growth direction for a wurtzite crystal structure, which is common for III-V and II-VI polar compound semiconductors.
FIG. 4B is a graphical representation of a Group V-polar and Group VI-polar surface with respect to the growth direction for a wurtzite crystal structure, which is common for III-V and II-VI polar compound semiconductors.

FIG. 4 illustrates the growth direction with respect to the polarity of the growth surface. FIG. 4 illustrates an example of the growth and the polar orientations of III-V or II-VI compound semiconductors with a wurtzite crystal structure. FIG. 4A illustrates an example of growth along the [0001] direction of the wurtzite crystal structure for group II or group III-polar layers. FIG. 4B illustrates an example of growth along the [000-1] direction of the wurtzite crystal structure for group V or group VI-polar layers.

The terminology Group II-polar as used herein and in the following claims means a Group II polar element in combination with a Group VI component to thereby create a II-VI semiconductor crystal structure in which the interface terminates on a layer of the Group II element, an example is shown in FIG. 4A. The Group II atoms can be zinc, manganese, cadmium or a combination of the above. Group V1 can be oxygen, sulfur, selenium, tellurium, or combinations of these.

The terminology Group III-polar as used herein and in the following claims means a Group III polar element in combination with a Group V component to thereby create a III-V semiconductor crystal structure in which the interface terminates on a layer of the Group III element, an example is shown in FIG. 4A. The Group III atoms can be aluminum, indium, gallium, boron, or combinations thereof', and Group V can be nitrogen, arsenic, phosphorous, antimony, or combinations of these.

The terminology Group VI-polar as used herein in the following claims means a Group VI polar element in combination with a Group II component to thereby create a II-VI semiconductor crystal structure in which the interface terminates on a layer of the Group VI element, an example is shown in FIG. 4B. The Group II atoms can be zinc, manganese, cadmium or a combination of the above. Group V1 can be oxygen, sulfur, selenium, tellurium, or combinations of these.

The terminology Group V-polar as used herein and in the following claims means a Group V polar element in combination with a Group III component to thereby create a III-V semiconductor crystal structure in which the interface terminates on a layer of the Group V element, an example is shown in FIG. 4B. The Group III atoms can be aluminum, indium, gallium, boron, or combinations thereof.

Figure 5:
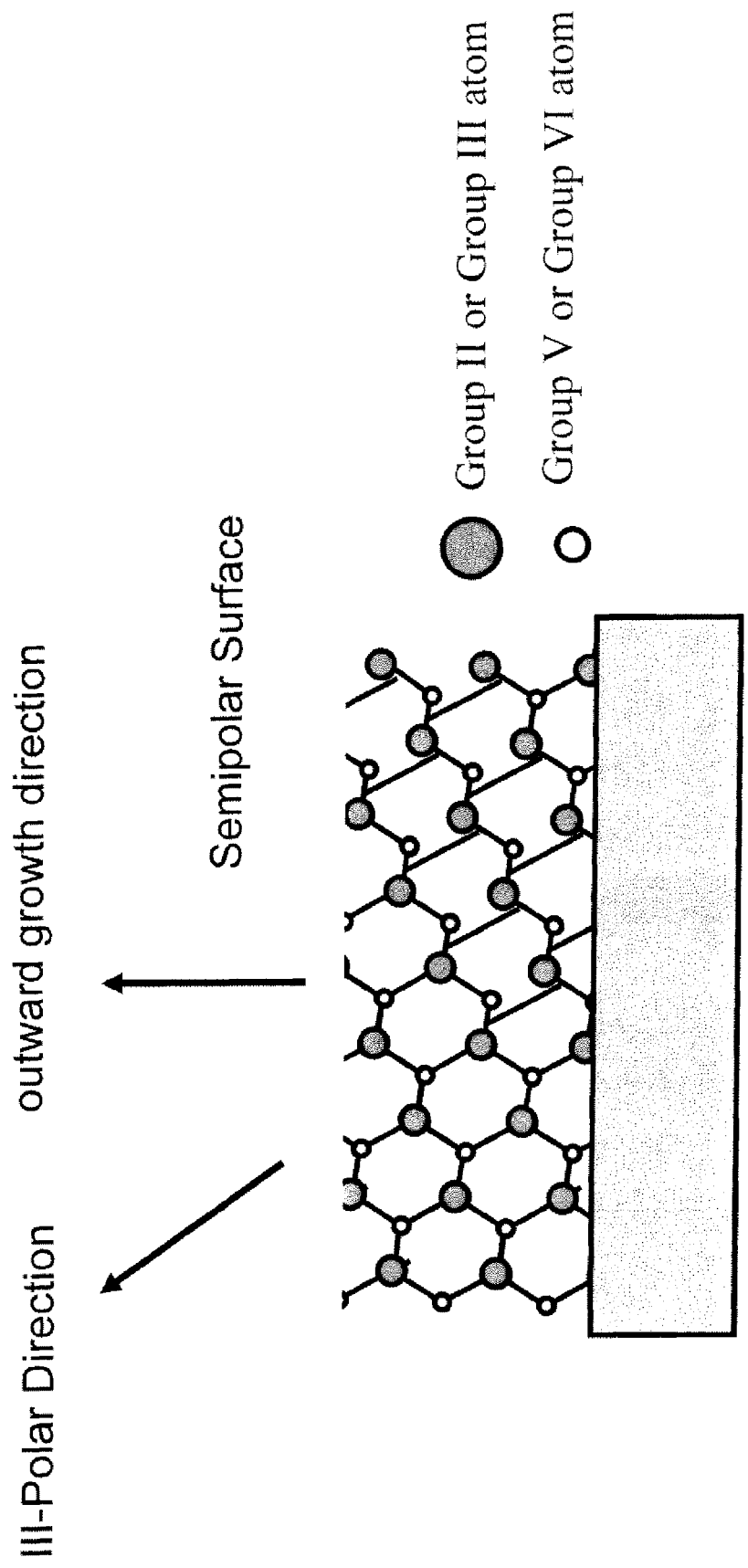
FIG. 5 is a graphical representation showing the outward growth direction for a semipolar material with a wurtzite crystal structure. Also shows the reference of the growth direction relative to a III-polar surface grown along the direction.

The terminology semipolar template as used herein means a template whose outward growth direction is not perpendicular or parallel to the polar axis of the template. FIG. 5 shows an example of a wurtzite structure grown along a semi polar direction.

The terminology group II-polarity template as used herein means a group II-polar template or a semipolar template with the angle between the outward growth direction and the group II-polar direction less than 90 degree.

The terminology group III-polarity template as used herein means a group III-polar template or a semipolar template with the angle between the outward growth direction and the group III-polar direction less than 90 degree.

The terminology group V-polarity template as used herein means a group V-polar template or a semipolar template with the angle between the outward growth direction and the group V-polar direction less than 90 degree.

The terminology group VI-polarity template as used herein means a group VI-polar template or a semipolar template with the angle between the outward growth direction and the group VI-polar direction less than 90 degree.

The terminology "total polarization" as used herein is the projection of the vector sum of the spontaneous polarization and the piezoelectric polarization on the spontaneous polarization direction.

The terminology "template" as used herein includes a buffer layer on a substrate or only a substrate without a buffer.

The terminology "electron blocking layer" as used herein means a layer which blocks electron overshoot from the n-type layer to the p-type layer. Since the n-type material emits light more efficiently, recombination of the holes and electrons is desired in the n-type material. The electron-blocking layer keeps electrons from escaping into the p-type layer.

The terminology "2D hole gas" as used herein means a very high density of holes in a very narrow region near the interface.

The total polarization charge at the heterointerface σ is derived from piezoelectric and spontaneous polarization of the polar semiconductor device structure. FIG. 1A shows a p-up device structure, and describes the general growth sequence where the p-layer is grown on top of the n-layer. The p-up describes the general growth sequence where the a template layer (2) is grown on top of a substrate (1) then the p-layer (4) is grown on top of the n-layer (3).

Figure 1B:
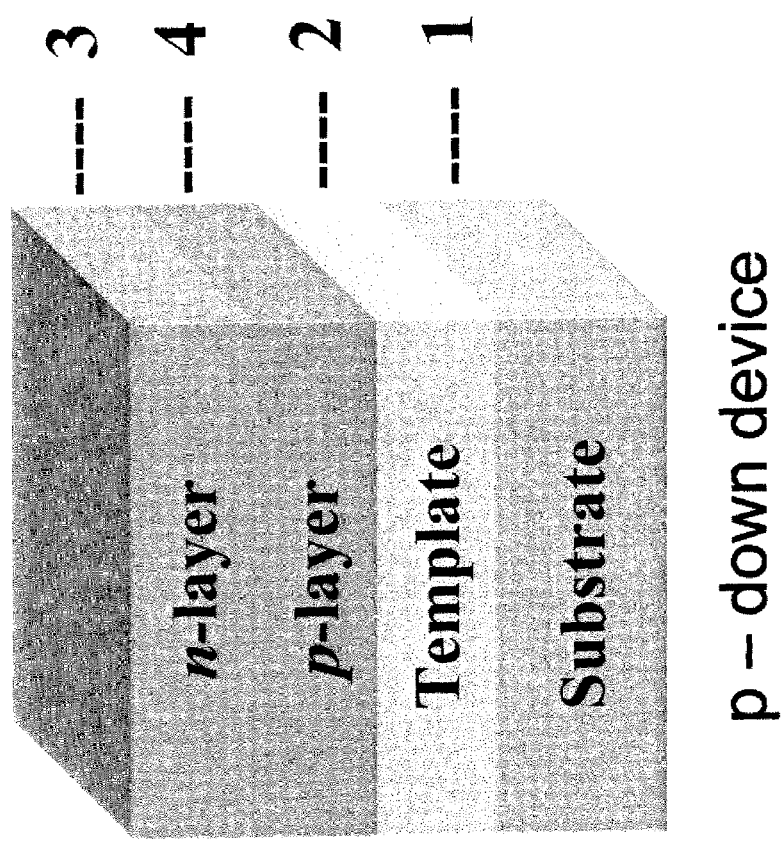
FIG. 1B shows a p-down device structure, and describes the general growth sequence where the n-layer is grown on top of the p-layer.

FIG. 1B shows a p-down device structure, and describes the general growth sequence where the n-layer is grown on top of the p-layer. The p-down describes the general growth sequence where the a template layer (2) is grown on top of a substrate (element 1) and the n-layer (3) is grown on top of the p-layer (4).

Figure 22:
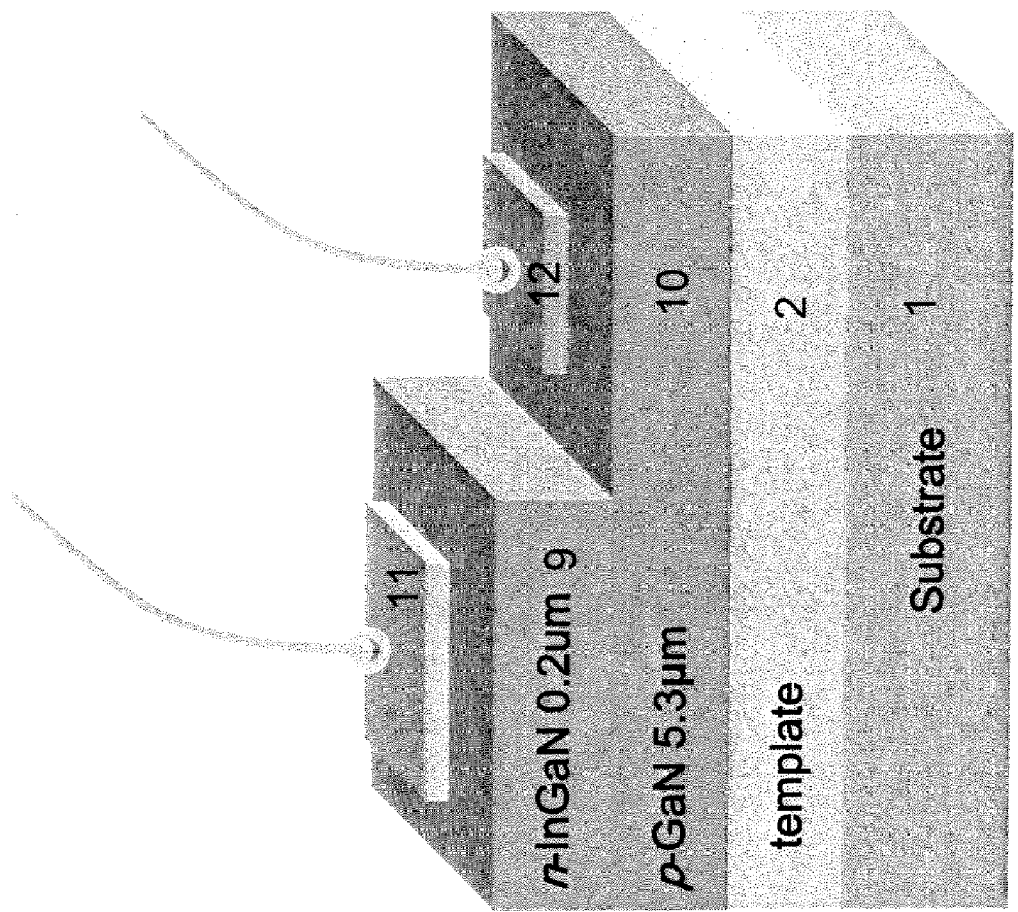
FIG. 22 is a graphical representation of a process device, which consists of a substrate 1, a template 2, a p-GaN layer 10, a n-InGaN layer 9, with a p-contact layer 12 and a n-contact layer 11.

FIG. 22 illustrates preferred embodiment single heterostructure p-down Ga polar InGaN/GaN LED, comprising a substrate (sapphire) (1), a buffer layer (2), a p-GaN layer (30), and an n-InGaN active layer (40) grown on Ga-terminated GaN, AlGaN, or AlN buffer or template, with a wider band gap p-doped grown first followed by a narrower band gap n-doped layer. The percentage of InN was approximately 14%. As used herein, the terminology "p-down" refers to the structure pictured in FIG. 22 wherein the p-layer 3 is under the n-layer 4. Also shown in FIG. 22 are the n and p electrical contacts 11 and 12, which are adapted to be connected to a power supply. The single heterojunction n-In0.13Ga0.87N/p-GaN was grown on an n-GaN template by hydride vapor phase epitaxy (HVPE) on a sapphire substrate. HVPE was preferred because it has higher growth rates (up to 100 µm) than MOCVD and MBE. Buffer layers were not required for growth of high quality, low defect density GaN. In the preferred embodiment of FIG. 22, p-GaN template is grown by HVPE with ~$1 \times 10^{19}$/cm$^3$ carrier concentration (doping concentration). As an example, the preferred embodiment of FIG. 22 may be produced using standard photolithography ICP/RIE to define MESA depth of 0.5 µm with E-beam evaporation of p-contact Ni/Au; 200 Å/1000 Å; RTA at 650° C. for 2 min in N2; RF sputtering of n-contact; ITO 1500 Å. Device area consists of 100 µm, 200 µm and 300 µm square devices.

Reflectivity and transmission measurements were performed using a Perkin Elmer Lambda 19 UV/VIS/IR spectrometer system on both the SH and the ITO. Based on these measurements the band-edge for the InGaN is ~421 nm (2.94 eV). XRD measurements performed showed an indium composition of ~13% (Vegard's Law) with a full width half max of 637 arcsec. Mesas were defined using standard RIE-ICP etching, with an etch depth of 0.5 μm for contact to p-GaN as shown in FIG. 11B. Ni/Au p-contacts were e-beam evaporated and annealed at 650° C. for 2 minutes in N2. Indium tin oxide (ITO) n-contacts were RF sputtered as the final step in the process. Wafer level testing was performed on the SH LEDs by placing them on top of a double-polished sapphire wafer for back emission into an integrating sphere. IV and transmission line measurements were performed using a HP4155B. TLM confirmed that the as-deposited Indium tin oxide (ITO) n-InGaN contact 5 is ohmic, while the Ni/Au p-GaN contact 6 exhibits Schottky behavior with a barrier height of 5V. This is most likely associated with p-GaN surface damage resulting from the etching process. An advantage of the embodiment of FIG. 22 over the prior art is the lower cost associated with raw materials and deposition process. As an example, fabrication of the FIG. 22 embodiment may comprise a p-GaN template grown by HVPE with ~1×10$^{19}$/cm$^3$ carrier concentration.

In the case where the p-type layer grown first in the structure has a first polarization vector, and the n-type layer grown on top of the p-type layer has a second polarization vector which forms the heterointerface. In all cases described below the p-type layer is a wider bandgap than the n-type layer regardless of growth sequence. For all cases described below a negative polarization charge appears at the heterointerface when the projection of the second polarization vector $\vec{P}_{T2}$ to the growth direction is larger than the projection of the first polarization vector $\vec{P}_{T1}$ to the growth direction as defined by the equation below:

$$(\vec{P}_{T1} - \vec{P}_{T2}) \cdot \vec{n} < 0$$

$$\vec{P}_{T1} = \vec{P}_{SP1} + \vec{P}_{PZ1}$$

$$\vec{P}_{T2} = \vec{P}_{SP2} + \vec{P}_{PZ2}$$

Where $\vec{P}_{SP1}$ and $\vec{P}_{PZ1}$ is the spontaneous and piezoelectric polarization vectors for layer 1, respectively and $\vec{P}_{SP2}$ and $\vec{P}_{PZ2}$ is the spontaneous and piezoelectric polarization vectors for layer 2, respectively; $\vec{n}$ is the vector along the growth direction.

The n-type layer grown first in the structure has a first polarization vector, and the p-type layer grown on top of the n-type layer has a second polarization vector which forms the heterointerface. In all cases described below the p-type layer is a wider bandgap than the n-type layer regardless of growth sequence. For all cases described below a negative polarization charge appears at the heterointerface when the projection of the second polarization vector $\vec{P}_{T2}$ to the growth direction is larger than the projection of the first polarization vector $\vec{P}_{T1}$ to the growth direction as defined by the equation below:

$$(\vec{P}_{T1} - \vec{P}_{T2}) \cdot \vec{n} < 0$$

$$\vec{P}_{T1} = \vec{P}_{SP1} + \vec{P}_{PZ1}$$

$$\vec{P}_{T2} = \vec{P}_{SP2} + \vec{P}_{PZ2}$$

Where $\vec{P}_{SP1}$ and $\vec{P}_{PZ1}$ is the spontaneous and piezoelectric polarization vectors for layer 1, respectively and $\vec{P}_{SP2}$ and $\vec{P}_{PZ2}$ is the spontaneous and piezoelectric polarization vectors for layer 2, respectively; $\vec{n}$ is the vector along the growth direction.

Figure 6:
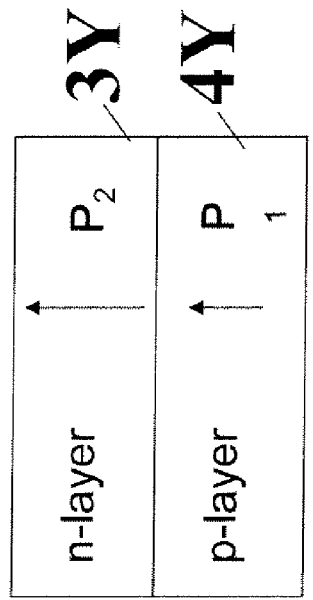
FIG. 6A illustrates the case of a Group II or Group III-polar device where a p-layer (element 4) is grown on a Group II or Group III-polar template, and then a n-layer (element 3) is grown on top of a p-layer (element 4). The p-type 4 has the first polarization vector and the n-type layer 3 has the second polarization vector, where the projection of second polarization vector to the growth direction is larger than the projection of the first polarization vector to the growth direction, when the n-type layer 3 is grown on the p-type layer 4, results in a negative polarization charge at the heterointerface.
FIG. 6B illustrates the case of a Group II or Group III-polar device where a n-layer (element 3) is grown on a Group II or Group III-polar template, and then a p-layer (element 4) is grown on top of a n-layer (element 3). A negative polarization charge at the heterointerface is achieved when total polarization of the p-layer 4 is larger than the total polarization of the n-layer 3. The n-type 3 has the first polarization vector and the p-type layer 4 has the second polarization vector, where the projection of second polarization vector to the growth direction is larger than the projection of the first polarization vector to the growth direction, when the p-type layer 4 is grown on the n-type layer 3, results in a negative polarization charge at the heterointerface.
FIG. 6C illustrates the case of a Group V or Group VI-polar device where a p-layer (4) is grown on a Group V or Group VI-polar template, and then a n-layer (3) is grown on top of a p-layer (4). The p-type 4 has the first polarization vector and the n-type layer 3 has the second polarization vector, where the projection of second polarization vector to the growth direction is larger than the projection of the first polarization vector to the growth direction, when the n-type layer 3 is grown on the p-type layer 4, results in a negative polarization charge at the heterointerface.
FIG. 6D illustrates Group V or Group VI-polar device where a n-layer (3) is grown on a Group V or Group VI-polar template, and then a p-layer (4) is grown on top of a n-layer (3). A negative polarization charge at the heterointerface is achieved when total polarization of a p-layer 4 is larger than the total polarization of the n-layer 3. The n-type 3 has the first polarization vector and the p-type layer 4 has the second polarization vector, where the projection of second polarization vector to the growth direction is larger than the projection of the first polarization vector to the growth direction, when the p-type layer 4 is grown on the n-type layer 3, results in a negative polarization charge at the heterointerface.

FIG. 6A illustrates the case of a Group II or Group III-polar device where a p-layer (element 4) is grown on a Group II or Group III-polar template, and then a n-layer (element 3) is grown on top of a p-layer (element 4). The p-type 4 has the first polarization vector and the n-type layer 3 has the second polarization vector, where the projection of second polarization vector to the growth direction is larger than the projection of the first polarization vector to the growth direction, when the n-type layer 3 is grown on the p-type layer 4, results in a negative polarization charge at the heterointerface.

Figure 6D:
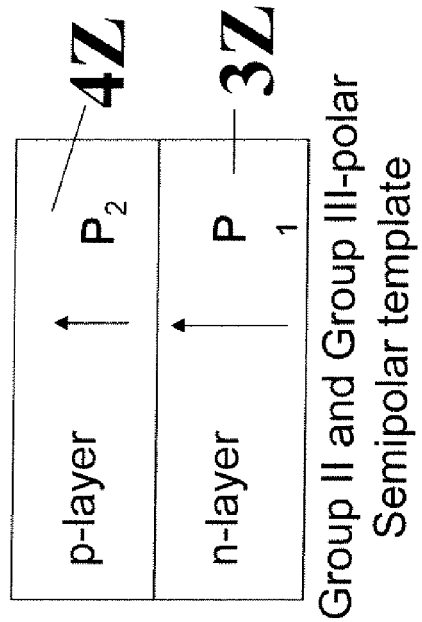
Figure 6:
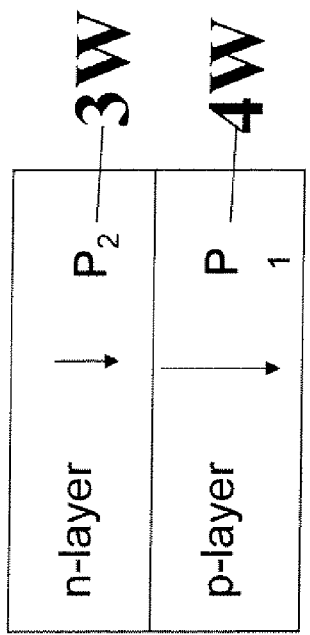
Figure 6B:
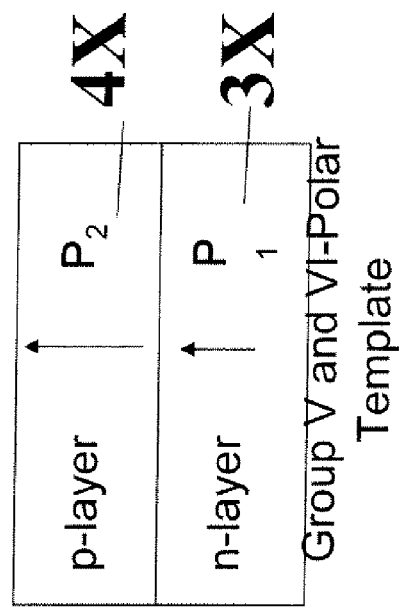

FIG. 6B illustrates the case of a Group II or Group III-polar device where a p-layer (element 3) is grown on a Group II or Group III-polar template, and then a p-layer (element 4) is grown on top of a n-layer (element 3). A negative polarization charge at the heterointerface is achieved when total polarization of the p-layer 4 is larger than the total polarization of the n-layer 3. The n-type 3 has the first polarization vector and the p-type layer 4 has the second polarization vector, where the projection of second polarization vector to the growth direction is larger than the projection of the first polarization vector to the growth direction, when the p-type layer 4 is grown on the n-type layer 3, results in a negative polarization charge at the heterointerface.

FIG. 6C illustrates the case of a Group V or Group VI-polar device where a p-layer (element 4) is grown on a Group V or Group VI-polar template, and then a n-layer (element 3) is grown on top of a p-layer (element 4). The p-type 4 has the first polarization vector and the n-type layer 3 has the second polarization vector, where the projection of second polarization vector to the growth direction is larger than the projection of the first polarization vector to the growth direction, when the n-type layer 3 is grown on the p-type layer 4, results in a negative polarization charge at the heterointerface.

FIG. 6D illustrates Group V or Group VI-polar device where a n-layer (element 3) is grown on a Group V or Group VI-polar template, and then a p-layer (element 4) is grown on top of a n-layer (element 3). A negative polarization charge at the heterointerface is achieved when total polarization of a p-layer 4 is larger than the total polarization of the n-layer 3. The n-type 3 has the first polarization vector and the p-type layer 4 has the second polarization vector, where the projection of second polarization vector to the growth direction is larger than the projection of the first polarization vector to the growth direction, when the p-type layer 4 is grown on the n-type layer 3, results in a negative polarization charge at the heterointerface.

FIG. 7A illustrates the polarization vectors for a single heterostructure grown on a Ga-polar GaN template grown along the [0001] wurtzite direction, where a p-GaN layer (element 10) is grown on the Ga-polar surface, then a n-InGaN layer (element 9) is grown on a p-GaN layer 10, representative of a p-down device. The p-GaN 10 has the first polarization vector and the n-InGaN layer 9 has the second polarization vector, where the projection of second polarization vector to the growth direction is larger than the projection of the first polarization vector to the growth direction, when the n-InGaN layer 9 is grown on the p-GaN layer 10, results in a negative polarization charge at the heterointerface. FIG. 7B illustrates the polarization vectors for a single heterostructure grown on a N-polar GaN template grown along the [−0001] wurtzite direction, where a n-InGaN layer (element 9) is grown on the N-polar surface, then a p-GaN layer (element 10) is grown on a n-InGaN layer 9, representative of a p-up device. The n-InGaN 9 has the first polarization vector and the p-GaN layer 10 has the second polarization vector, where the projection of second polarization vector to the growth direction is larger than the projection of the first polarization vector to the growth direction, when the p-GaN layer 10 is grown on the n-InGaN layer 9, results in a negative polarization charge at the heterointerface.

FIG. 7C illustrate the polarization vectors of a Ga-polar device grown along the [10-1-1] wurtzite direction, where a p-GaN layer 10 is grown on the Ga-polar surface, then a n-InGaN layer 9 is grown on the n-InGaN layer 10. The p-GaN 10 has the first polarization vector and the n-InGaN layer 9 has the second polarization vector, where the projection of second polarization vector to the growth direction is larger than the projection of the first polarization vector to the growth direction, when the n-InGaN layer 9 is grown on the p-GaN layer 10, results in a negative polarization charge at the heterointerface.

FIG. 7D illustrate the polarization vectors for a Ga-polar device grown along the [11-22] wurtzite direction, where a n-InGaN layer (element 9) is grown on the Ga-polar surface, then a p-GaN 10 is grown on top of a n-InGaN layer 9. The direction of the piezoelectric polarization at the n-InGaN/p-GaN heterointerface inverses as a result of strain along the [11-22], resulting in a negative polarization charge at the heterointerface. The n-InGaN 9 has the first polarization vector and the p-GaN layer 10 has the second polarization vector, where the projection of second polarization vector to the growth direction is larger than the projection of the first polarization vector to the growth direction, when the p-GaN layer 10 is grown on the n-InGaN layer 9, results in a negative polarization charge at the heterointerface.

Figure 8:
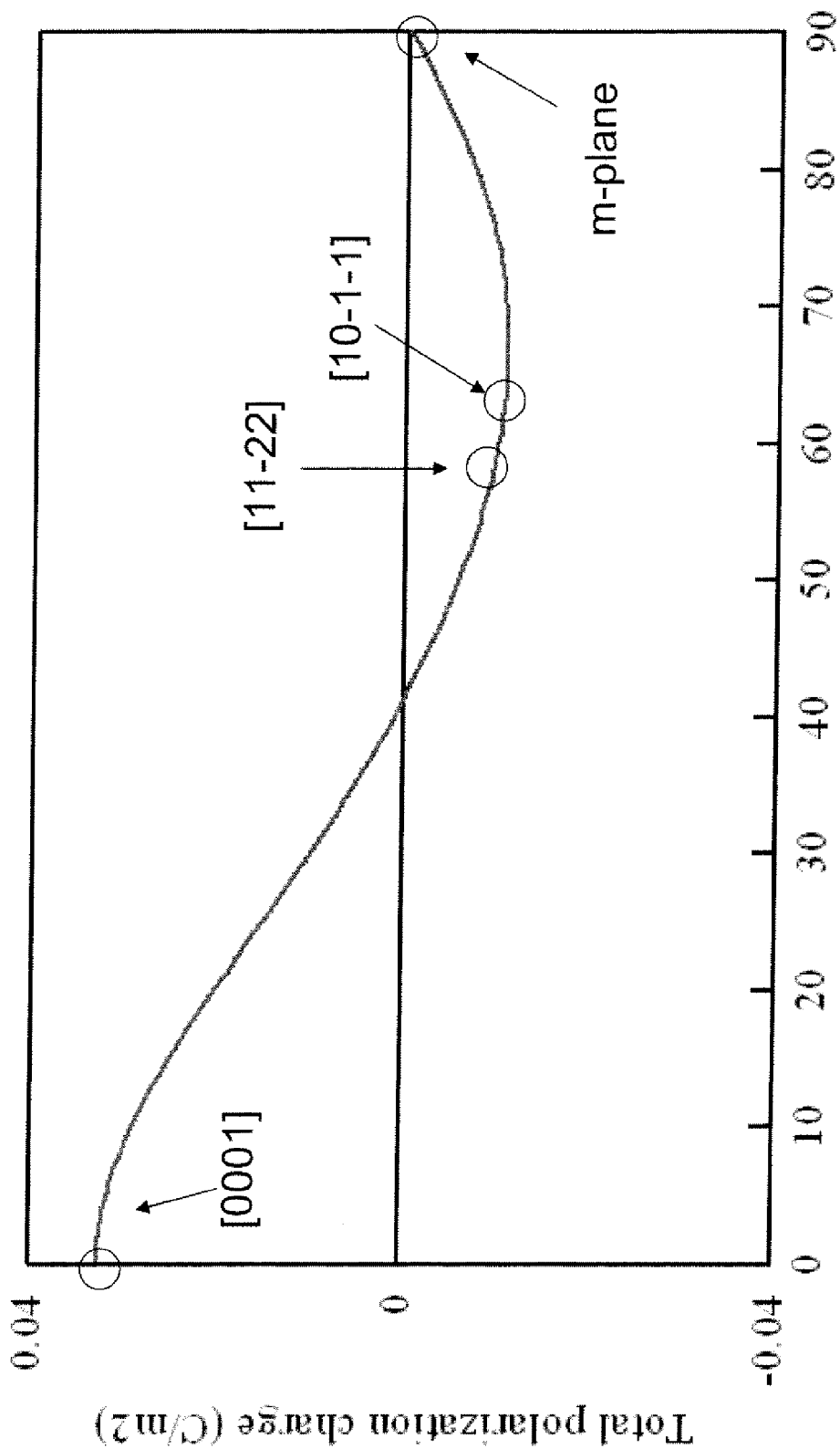
FIG. 8 shows the total polarization charge at the n-InGaN/p-GaN heterointerface for a Ga-polar p-up device as a function of the crystallographic growth orientation.

FIG. 8 shows the total polarization charge at the n-GaN/n-InGaN/p-GaN heterointerface for a Ga-polar p-up MQW device as a function of the crystallographic growth orientation. The total polarization charge is calculated for the n-InGaN/p-GaN heterointerface and changes sign from positive to negative as a function inclination angle. The inclination angle is defined as the angle between the growth direction and the [0001] wurtzite direction. FIG. 8 shows that the [11-22] orientation shows a negative total polarization charge for this configuration.

Wurtzite nitride heterostructures grown along the [0001] direction possess strong built-in electric fields associated with the termination of large spontaneous and piezoelectric polarizations at the hetero-interfaces ($\sigma=10^{12}$-$10^{13}$ e/cm$^2$).

As referenced in the foregoing, the polarization effect on InGaN/GaN and GaN/AlGaN quantum well light emitting diodes (LEDs) or lasers is considered detrimental. The electric field inside the quantum well generated by polarization sheet charges of opposite sign on either side of the quantum well reduces the emission efficiency in several ways. First, the strong electric field leads to a spatial separation of electrons and holes, which lowers the probability of radiative recombination and thus lowers the emission efficiency. Second, the strong localization due to the large field reduces the effective barrier height for electrons and holes, which promotes the carriers' escape from the quantum well. The above two considerations are applicable to both p-up and p-down Ga-polar devices. However, in a conventional p-up Ga-polar device, the positive polarization charge near the p-cladding layer combined with a small conduction band offset in the InGaN/GaN system further leads to electron overshoot, and thus decreases the injection efficiency. To reduce the electron overshoot, an electron-blocking layer with a larger band gap must be used. The large band gap electron blocking layer, however, increases the polarization field in the quantum well and creates a potential spike in the valence band, blocking the injection of holes. To circumvent the polarization effects in LEDs, devices are grown on non-polar enplane and a-plane substrates and on semi-polar substrates.

Figure 2:
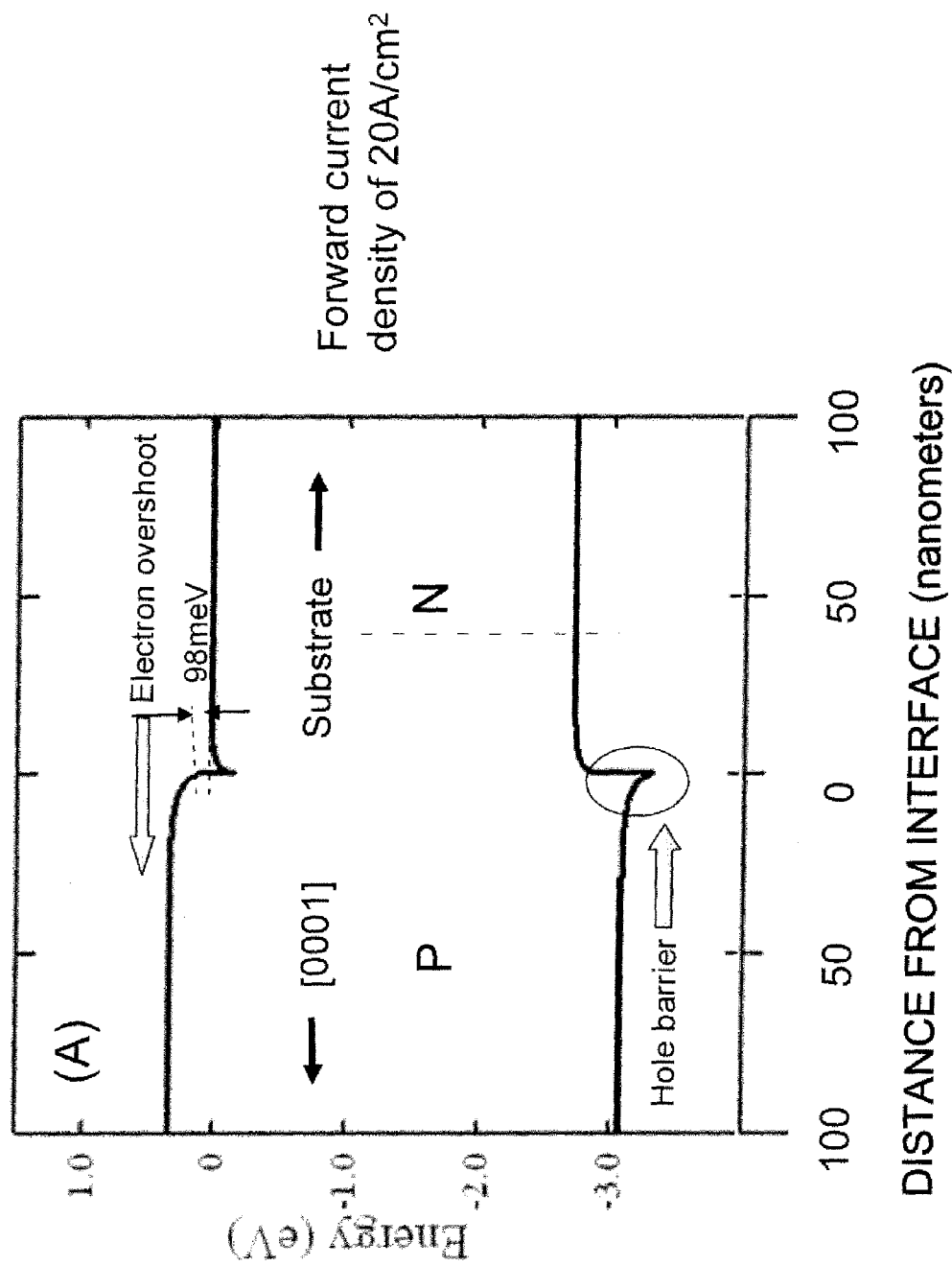
FIG. 2 is a graphical representation of the energy levels in the valence and conduction bands for a conventional prior art semiconductor having a "p-up" type configuration at a forward current density of 20 A/cm$^2$.
Figure 3A:
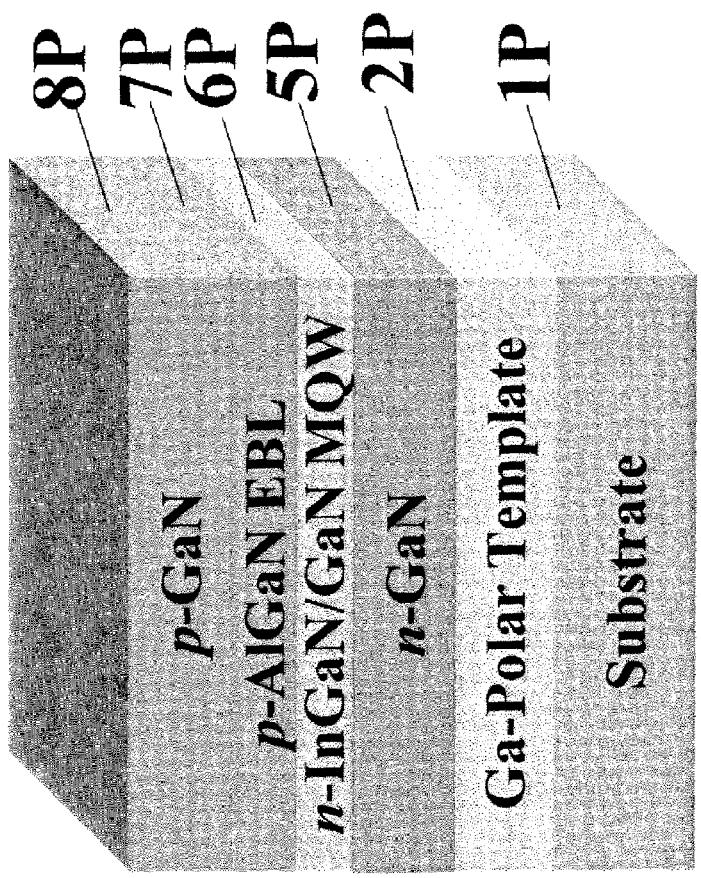
FIG. 3A shows a general description of conventional p-up Ga-polar InGaN/GaN LED, which consists of a substrate (sapphire), Ga-polar template, a n-GaN layer, a n-InGaN/GaN MQW, a p-AlGaN electron blocking layer, and an p-GaN active layer.
Figure 3B:
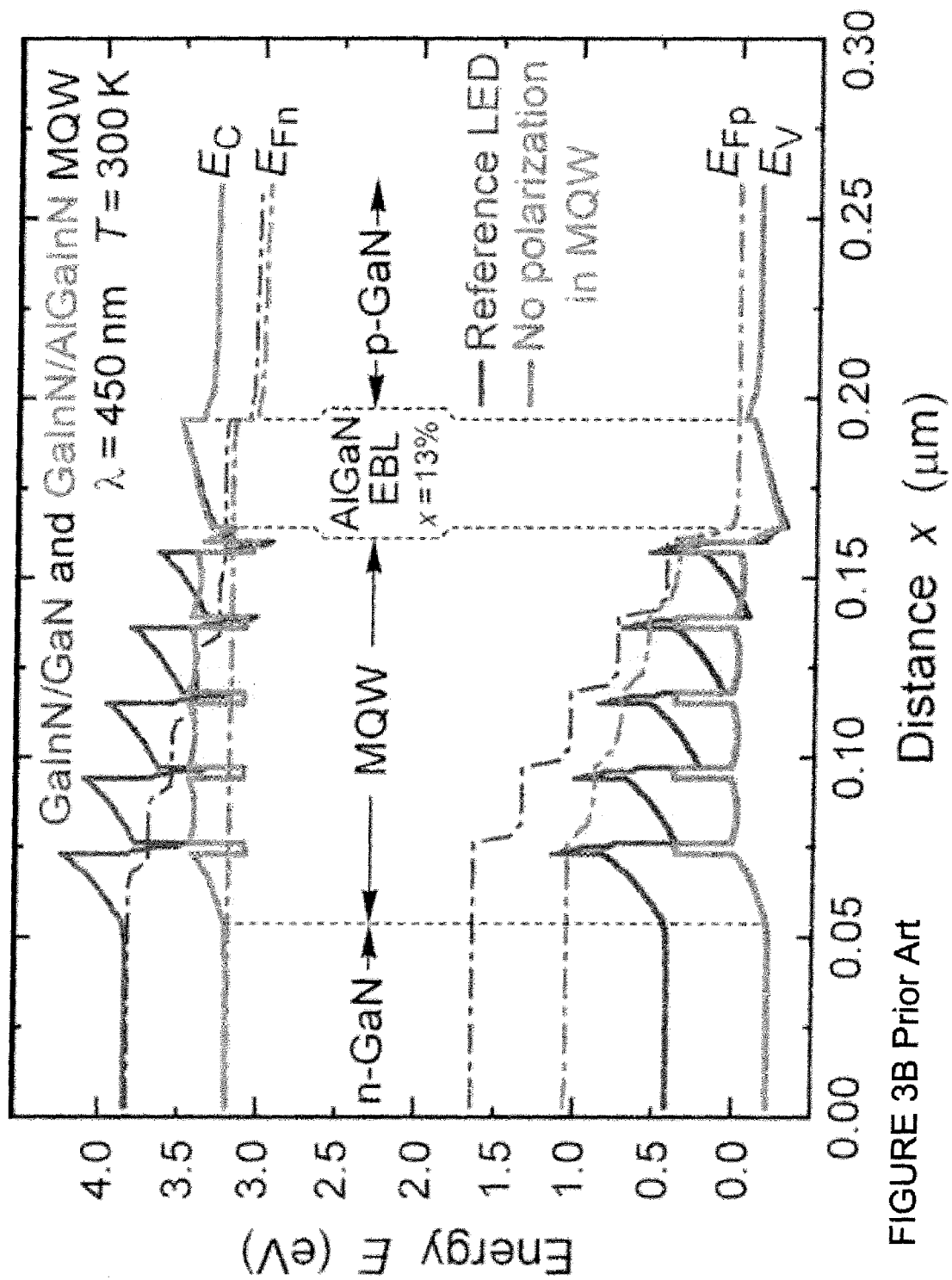
FIG. 3B is a graphical representation of a quantum well embodiment showing the polarization effect on InGaN/GaN QW LED is detrimental in conventional devices.

The p-side down Ga polar InGaN/GaN interface of the present invention was compared with a conventional p-up Ga polar device at forward bias of 2.7 volts. The spontaneous and piezoelectric polarization charge at the InGaN/GaN interface was estimated to be in the mid $10^{12}$/cm$^2$ range and negative for p-down Ga polar, positive for a p-up Ga polar, positive for p-down N polar, and negative for p-up N polar. For the conventional p-up Ga polar structure as shown in FIG. 2, the effective electron barrier was only about 98 meV, which leads to a significant leakage of electrons from the active n-InGaN to the p-GaN layer at room temperature, resulting in lower efficiency. Also, the injection of holes from the p-GaN to the n-InGaN results in a potential barrier as high as 807 meV, leading to a very inefficient injection of holes to the n-InGaN layer.

Figure 9:
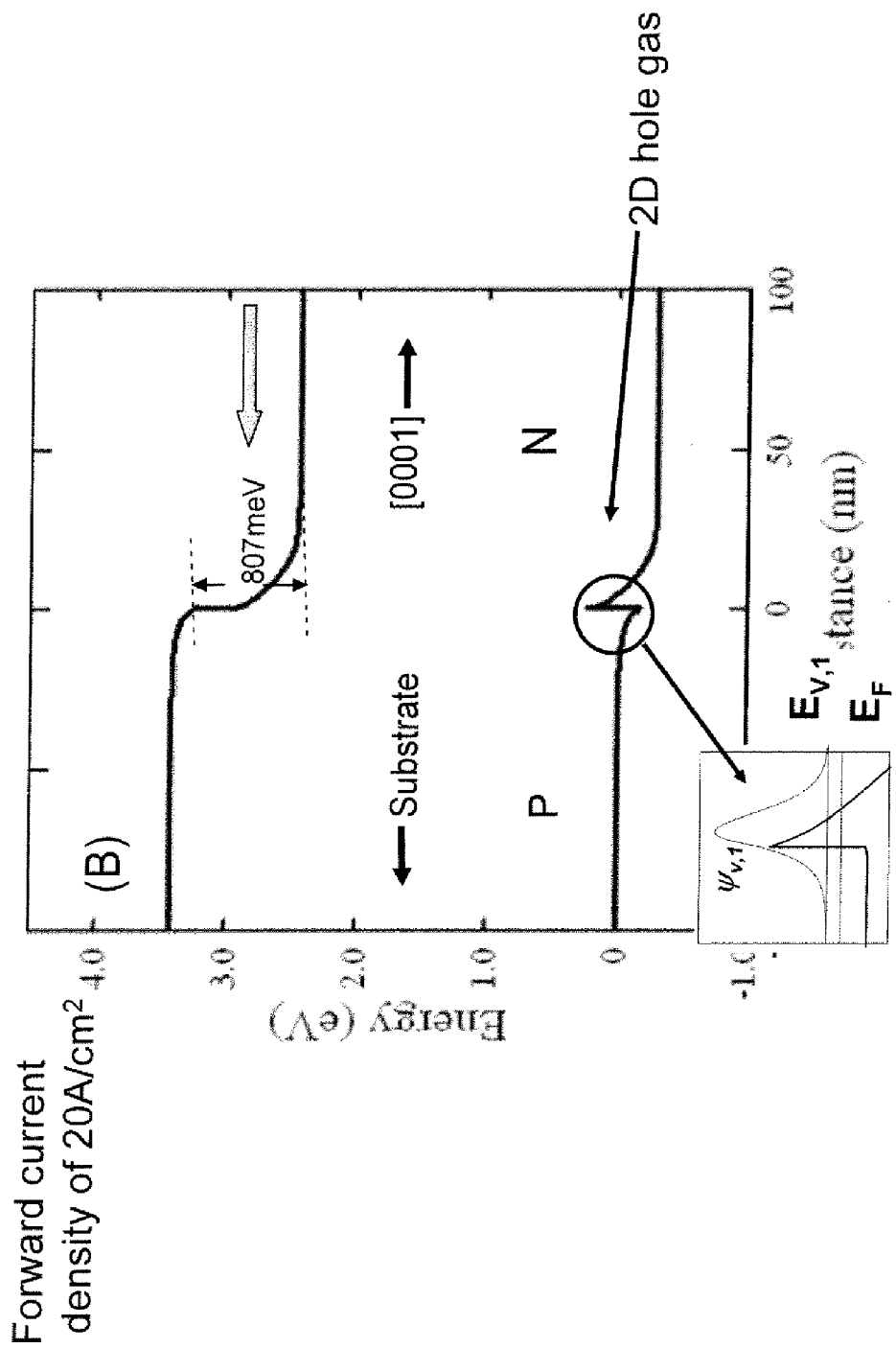
FIG. 9 illustrates the band diagrams at a forward current density of 20 A/cm$^2$ for a preferred embodiment p-down devices. Comparison can be made to FIG. 2, a similar diagram.

In a preferred embodiment of the present invention, the p-down Ga polar device as shown in FIG. 9, has an effective electron blocking barrier as high as 533 meV; for a potential improvement of up to 800%. Also, the hole-barrier substantially disappears with a 2D hole-gas near the interface, which greatly enhances the recombination of injected electrons with holes in the active layer, and also increases efficiency.

Photoluminescence measurements indicate that the large Auger recombination coefficient in InGaN, combined with the high carrier densities in InGaN/GaN quantum well LEDs, is the reason why the maximum quantum efficiency in these devices is observed at very low current density. Since the carrier densities in single and double heterojunction LEDs are lower, these devices should have higher external quantum efficiencies at the higher current densities required for applications such as general illumination, projection displays, and automotive headlights, making them attractive alternatives to quantum well LEDs. The effect of polarization charge inside a p-n heterojunction has different characteristics from those in a quantum well LED. In the following, both modeling and experimental results are presented on single p-n heterojunction light emitting structures with polarization charge.

Figure 10:
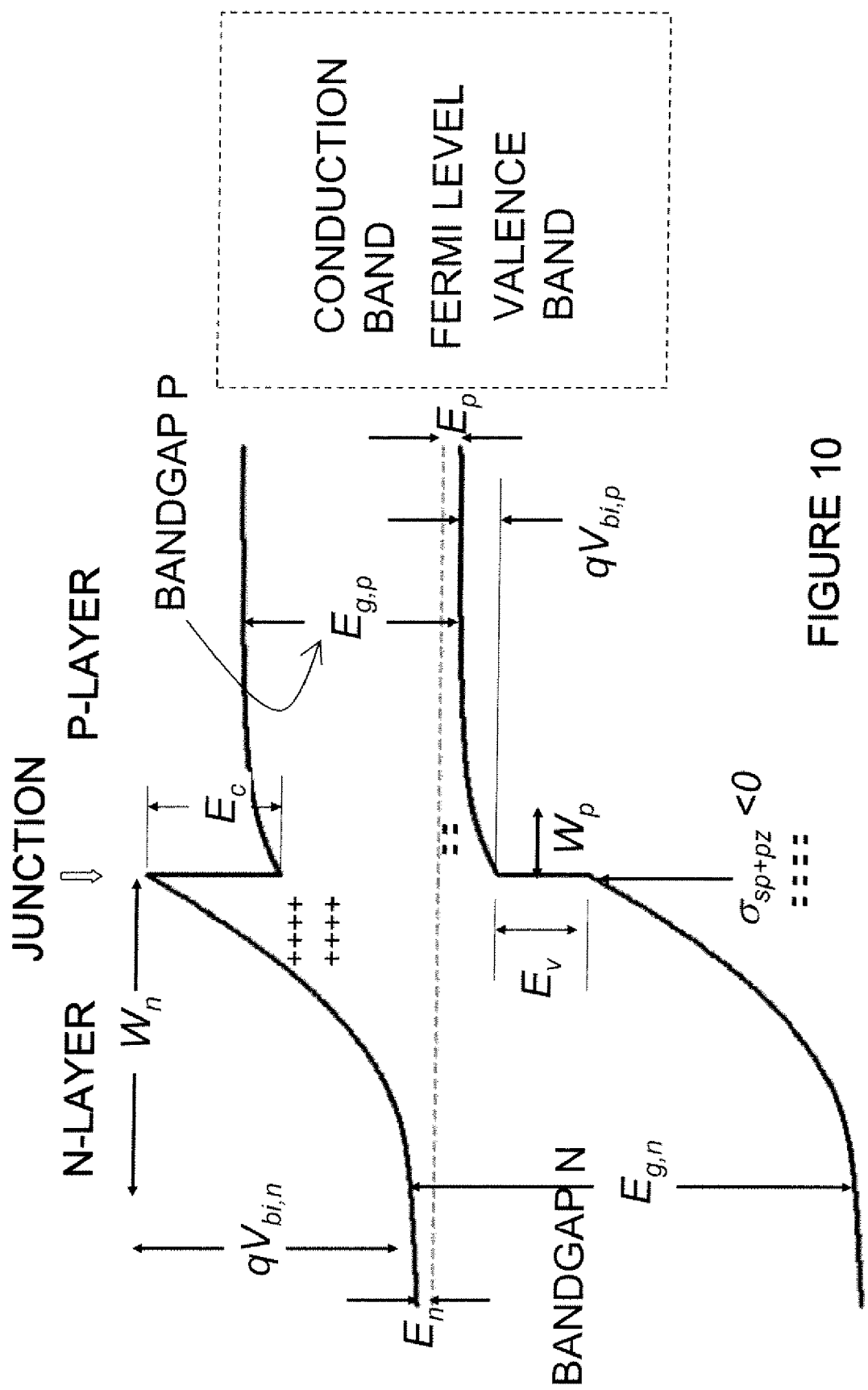
FIG. 10 is an illustration for a preferred embodiment of the present invention depicting a band diagram for a p-n heterojunction with a negative polarization charge.

FIG. 10 is an energy band diagram for a preferred embodiment of the present invention, an n-type semiconductor with a band gap of $E_{g,n}$, and a donor concentration of $N_D$ that forms a heterojunction with a p-type semiconductor with a band gap of $E_{g,p}$ and an acceptor concentration of $N_A$.

At the hetero-interface, there is a sheet charge density of $\sigma_{sp+pz}$. Since the electric field in the neutral regions (far from the junction) must be zero, charge neutrality requires:

$$N_D W_n + \sigma_{sp+pz} - N_A W_p = 0 \quad (1)$$

where $W_{n(p)}$ is the depletion width in the n (p) region. Under abrupt approximation, the total built-in voltage is given by $$\frac{qN_D}{2\varepsilon_n}W_n^2 + \frac{qN_A}{2\varepsilon_p}W_p^2 = V_{bi,n} + V_{bi,p} = V_{bi} \quad (2)$$

where $\varepsilon_{n(p)}$ is the dielectric constant for n-(p-) type material, q is the electron charge, and $$qVbi = QcEg,n + (1-Qc)Eg,p - En - Ep \quad (3),$$

with Qc the conduction band offset ratio and En(p) the conduction (valence) band energy with respect to the Fermi level in the neutral region.

At $\sigma_{sp+pz}=0$, the depletion widths are $$W_n(0) = \sqrt{\frac{2V_{bi}\varepsilon_n}{qN_D}} \sqrt{\frac{1}{1+k}} \quad (4)$$

$$W_p(0) = \sqrt{\frac{2V_{bi}\varepsilon_p}{qN_A}} \sqrt{\frac{k}{1+k}},$$

where $$k = \frac{N_D}{N_A} \frac{\varepsilon_n}{\varepsilon_p}.$$

For $\sigma_{sp+pz} \neq 0$, $$W_n(\sigma_{sp+pz}) = W_n(0)\left[\sqrt{1 - \frac{k}{(1-k)^2}\lambda^2} - \frac{k}{1+k}\lambda\right] \quad (5)$$

$$W_p(\sigma_{sp+pz}) = W_p(0)\left[\sqrt{1 - \frac{k}{(1+k)^2}\lambda^2} + \frac{1}{1+k}\lambda\right],$$

where $$\lambda = \frac{\sigma_{sp+pz}}{N_D W_n(0)} = \frac{\sigma_{sp+pz}}{N_A W_p(0)}$$

is the normalized polarization sheet charge density. The band bending in the n- and p-type material is given by $$qV_{bi,n}(\sigma_{sp+pz}) = qV_{bi}\frac{1}{1+k}\left[\sqrt{1 - \frac{k}{(1+k)^2}\lambda^2} - \frac{k}{1+k}\lambda\right]^2 \quad (6)$$

$$qV_{bi,p}(\sigma_{sp+pz}) = qV_{bi}\frac{k}{1+k}\left[\sqrt{1 - \frac{k}{(1+k)^2}\lambda^2} + \frac{1}{1+k}\lambda\right]^2$$

Figure 11:
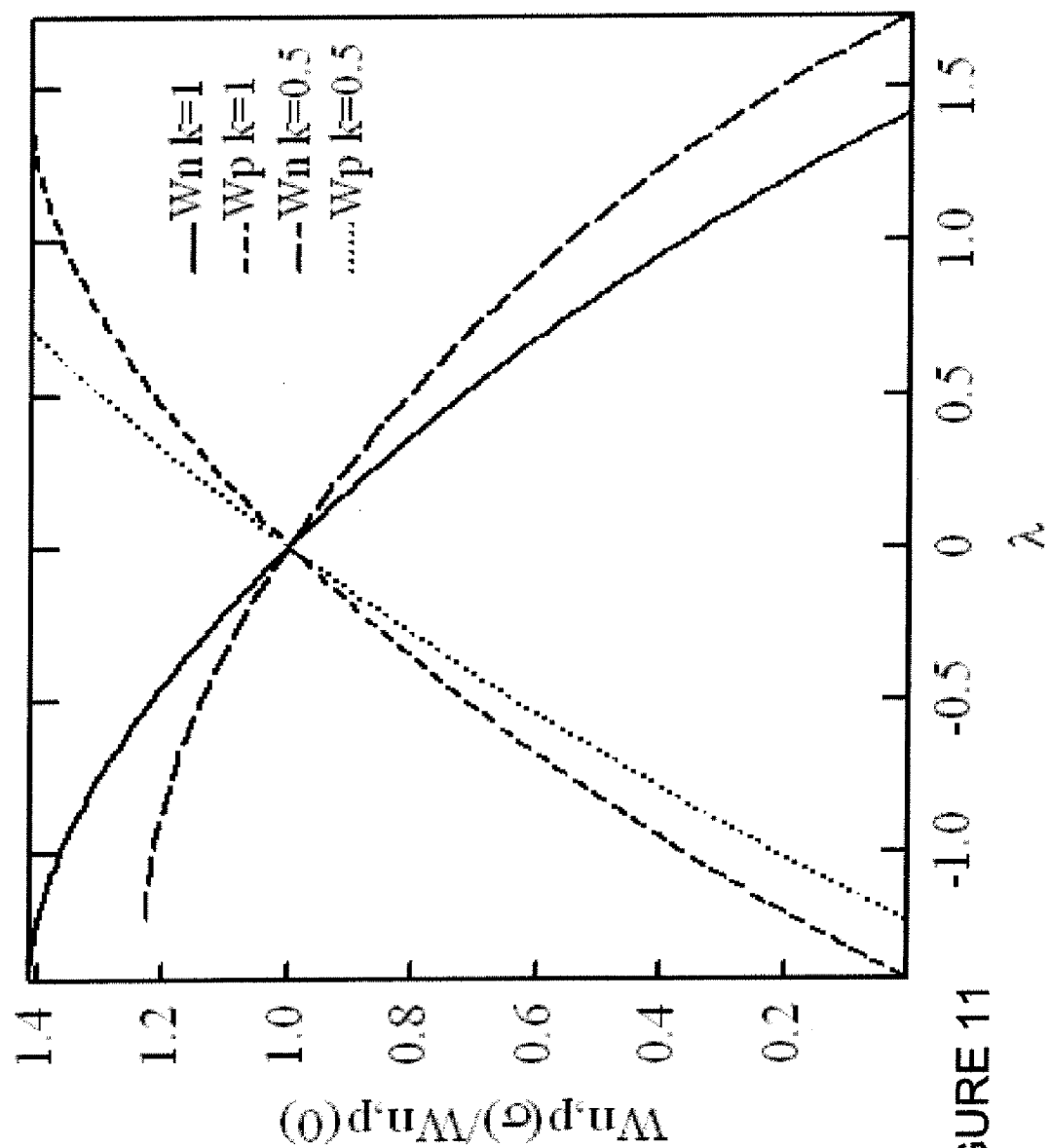
FIG. 11 is a graphical illustration of the normalized depletion width as a function of normalized polarization charge density.

FIG. 11 is a graphical illustration of the normalized depletion width $W_{n,p}(\sigma_{Sp+pz})/W_{n,p}(0)$ as a function of normalized polarization charge density $\lambda$ at k=1 and 0.5. Negative interface charge increases (decreases) the depletion width in the n-(p-) region with the band bending increasing and decreasing correspondingly. This can be understood from the charge neutrality requirement (Eq. 1) that negative interface charge requires more positive space charge from the depleted n-type layer to compensate, while positive interface charge requires more negative space charge from the depleted p-type region to compensate. However, the usable space charge in the n- and p-layer is limited and thus Eqs. 5-6 are valid only when the limitation is not reached. Since the maximum band bending is limited to the band gap, the maximum positive (negative) space charge per unit area in an n- (p-) type material is given by $$\sigma_{+(-),max} = \sqrt{\frac{2N_{D(A)}(E_{g,n(p)} - E_{n(p)})\varepsilon_{n(p)}}{q}}. \quad (7)$$

Figure 12:
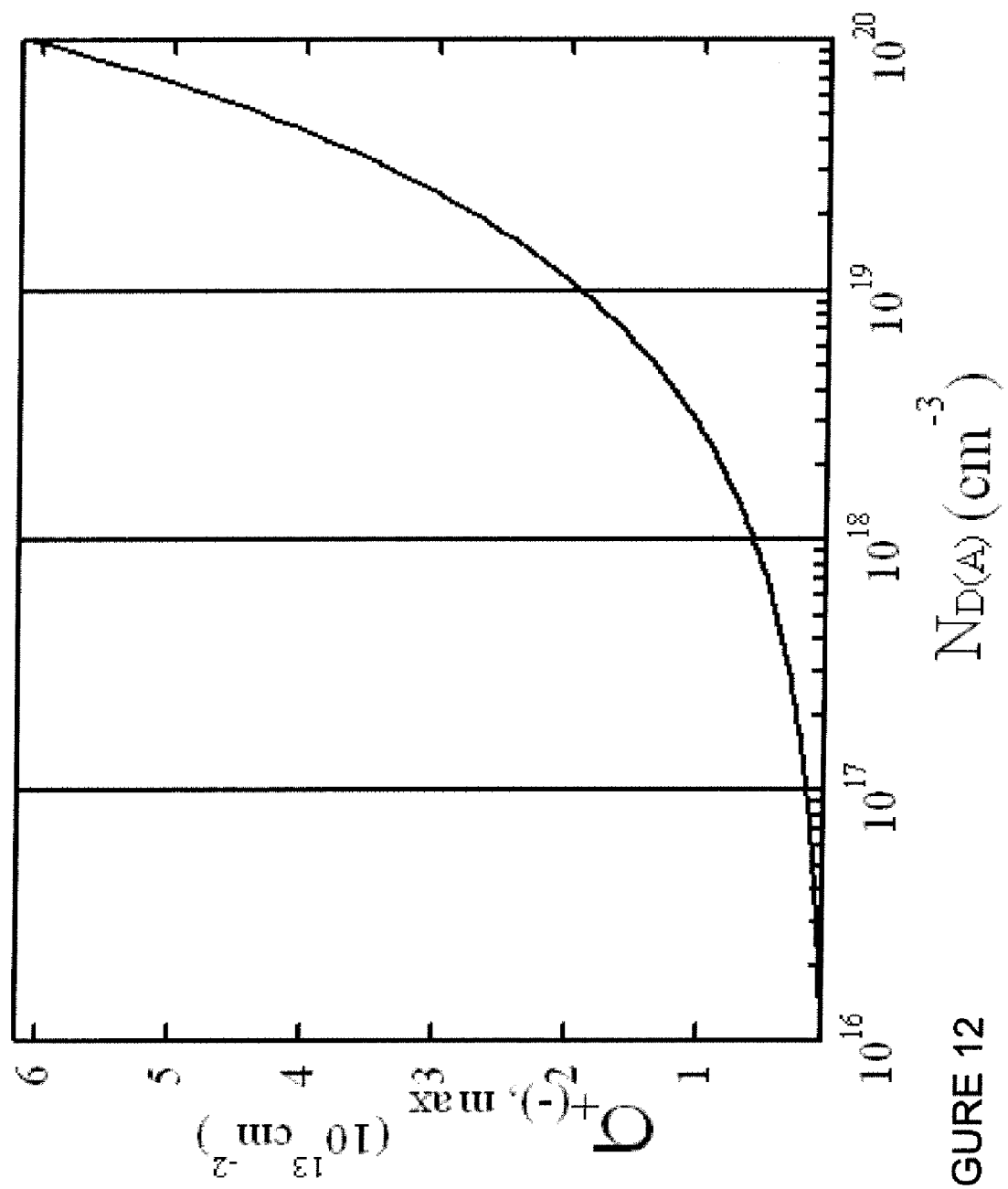
FIG. 12 shows $\sigma_{+(-),max}$ as a function of $N_D$ and $N_A$ for GaN.

FIG. 12 shows $\sigma_{+(-),max}$ as a function of $N_D$ and $N_A$ for GaN. In the case where $|\sigma_{sp+pz}| > \sigma_{+(-),max}$, a 2DEG (for $\sigma_{sp+pz} > 0$) or 2DHG (for $\sigma_{sp+pz} < 0$) forms near the interface to compensate for the excess $\sigma_{sp+pz}$. The density of the 2DEG (or 2DHG) is then given by:

$$\sigma_{2DEG(2DHG)} = |\sigma_{sp+pz}| - \sigma_{+(-),max} \quad (8).$$

To form a 2D hole gas at the heterointerface the following conditions pertaining to n-type doping must be met to satisfy Eq. 8. The doping density in the n-type layer is given by the formula:

$$N_D < \frac{q\sigma^2}{2\Delta E_g \varepsilon_0}. \quad (9)$$

where $N_D$ is the doping density, q is the electron charge ($1.6 \times 10^{-19}$; coulombs); $\sigma$ is the spontaneous and piezoelectric polarization charge density, $\Delta E_g$ is the band gap difference between n- and p-layers, and $\varepsilon_0$ is the dielectric constant of the n-type material.

Figure 13A:
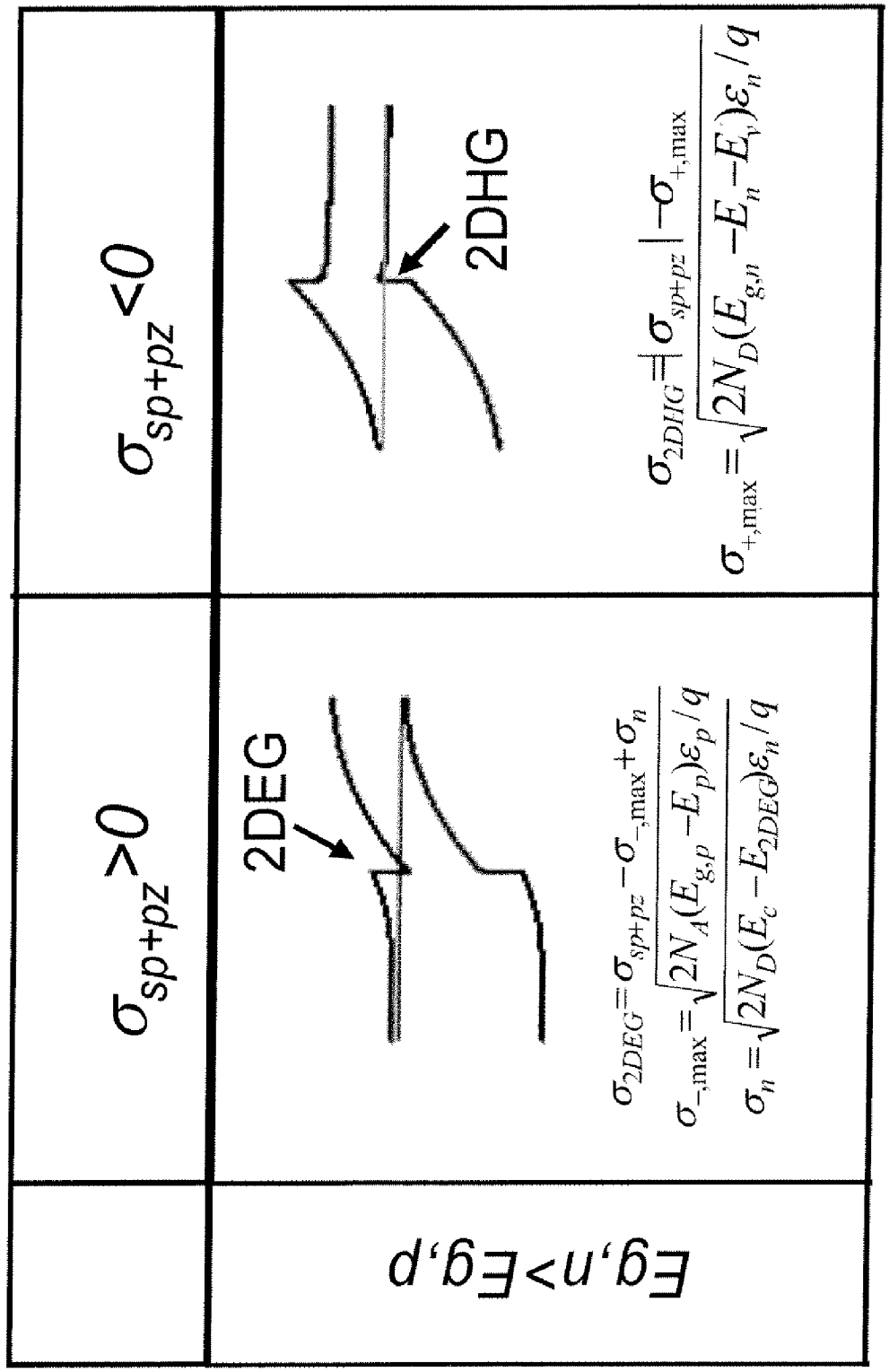
FIGS. 13A and 13B illustrate 2D electron gas and 2D hole gas in various p-n heterojunctions with polarization charge larger than the maximum space charge.
Figure 13B:
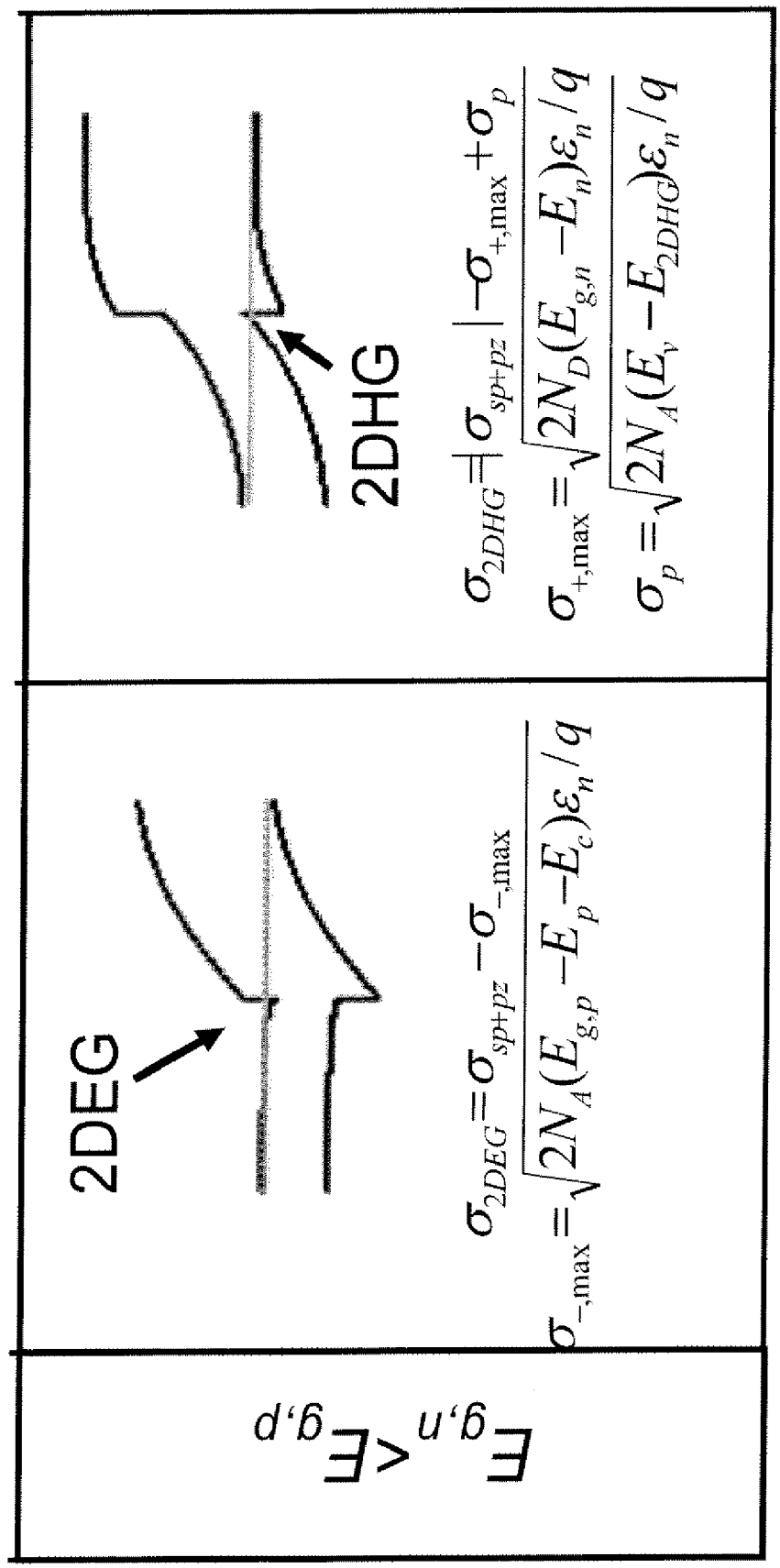

The 2DEG (2DHG) always appears near the hetero-interface and in the material with a smaller band gap. Therefore the conduction (valence) band offset $E_c$ ($E_v$) may sometimes become involved in the calculation of maximum space charge, depending on the band gaps of the two materials. One can summarize the results under various conditions in FIGS. 13A and 13B. Also included in the calculation are the finite band bending in the 2DEG and 2DHG. Neglecting the small difference between the Fermi level and the first confined quantum level and assuming an asymmetric triangle quantum well, one can find the band bending in the 2DEG (2DHG) region as:

$$E_{2DEG(2DHG)} \approx 2.388\left(\frac{q^2 F_{max}^2 \hbar^2}{2m_{e(h)}}\right)^{1/3}, \quad (10)$$

with $F_{max}$ the electric field corresponding to $\sigma_{+(-),max}$, $$F_{max} = \frac{q\sigma_{+(-),max}}{\varepsilon_{n(p)}}. \quad (11)$$

Considering for an example two Ga-polar n-InGaN/p-GaN structures; one is p-up and the other is p-down. The spontaneous and piezoelectric polarization charge ($\sigma_{sp+pz}$) at the InGaN/GaN interface is estimated to be about $1.4 \times 10^{13}$ e/cm² and positive (negative) for p-up (p-down) Ga-polar structure. The maximum negative depletion charge in the p-up structure is $\sigma_{-,max} = 1.8 \times 10^{13}$ e/cm² $> |\sigma_{sp+pz}|$. Therefore, there is no 2D electron gas in this structure. The calculated band bending in the n-type material is 20% of the total band bending ($qV_{bi}$), while in a similar structure without polarization charge the band bending in the n-region is ~90% of the total band bending. In the p-down structure, the maximum positive depletion charge is $\sigma_{+,max} = 5.7 \times 10^{12}$ e/cm² $< |\sigma_{sp+pz}|$. Therefore, a 2D hole gas forms within the InGaN near the n-InGaN/p-GaN interface. The calculated 2D hole gas density is about $1.0 \times 10^{13}$ e/cm², which is in good agreement with the result obtained from a numerical simulation discussed below. Almost 100% of the band bending is in the conduction band.

Description follows of the numerical simulation or the modeling of the p-up and p-down structure, described previously, by numerically solving the one-dimensional Poisson-Schrodinger equations self-consistently. A quantum zone is defined sandwiched between two classical zones. The electric potential is simulated in the quantum zone and extended it continuously to a constant value outside the quantum zone. The total charge is the sum of the ionized doping charges ($N^*_D$, $N^*_A$), the free electron and hole charges ($n_{free}$, $p_{free}$), the quantum-confined electron and hole charges, and the polarization interface charge:

$$\rho(x) = q\left[N_D^*(x) - N_A^*(x) - n_{free}(x) + p_{free}(x) - \sum_i n_{c,i}\psi_{c,i}^*(x)\psi_{c,i}(x) + \sum_i n_{v,i}\psi_{v,i}^*(x)\psi_{v,i}(x)n_{V,i} + \sigma_{sp+pz}\delta(x - x_0)\right],$$ (12)

where $x_0$ is the location of the hetero-interface and $n_{C(V),i}$ is the occupation of the $i^{th}$ electron (hole) sub-band, with its wave-function $y_{c(v),i}(x)$ determined by the one dimensional Schrodinger equation:

$$\frac{\hbar^2}{2}\frac{d}{dx}\left(\frac{1}{m_{e(h)}(x)}\frac{d}{dx}\psi_{C(V),i}(x)\right) \pm (E_{C(V)}(x) - E_{C(V),i})\psi_{C(V),i}(x) = 0,$$ (13)

where $E_{C(V)}(x)$ is the conduction (valence) band profile, $m_{e(h)}$ is the electron (hole) effect mass along the x direction, $E_{C(V),i}$ is the energy of the $i^{th}$ confinement electron (hole) sub-band, and + and − signs are for electrons and holes, respectively. To distinguish quantum confined charge from free charge, a cut-off value is set at the lower potential boundary of the quantum zone. Fermi-Dirac statistics are used for free charges.

Figure 14:
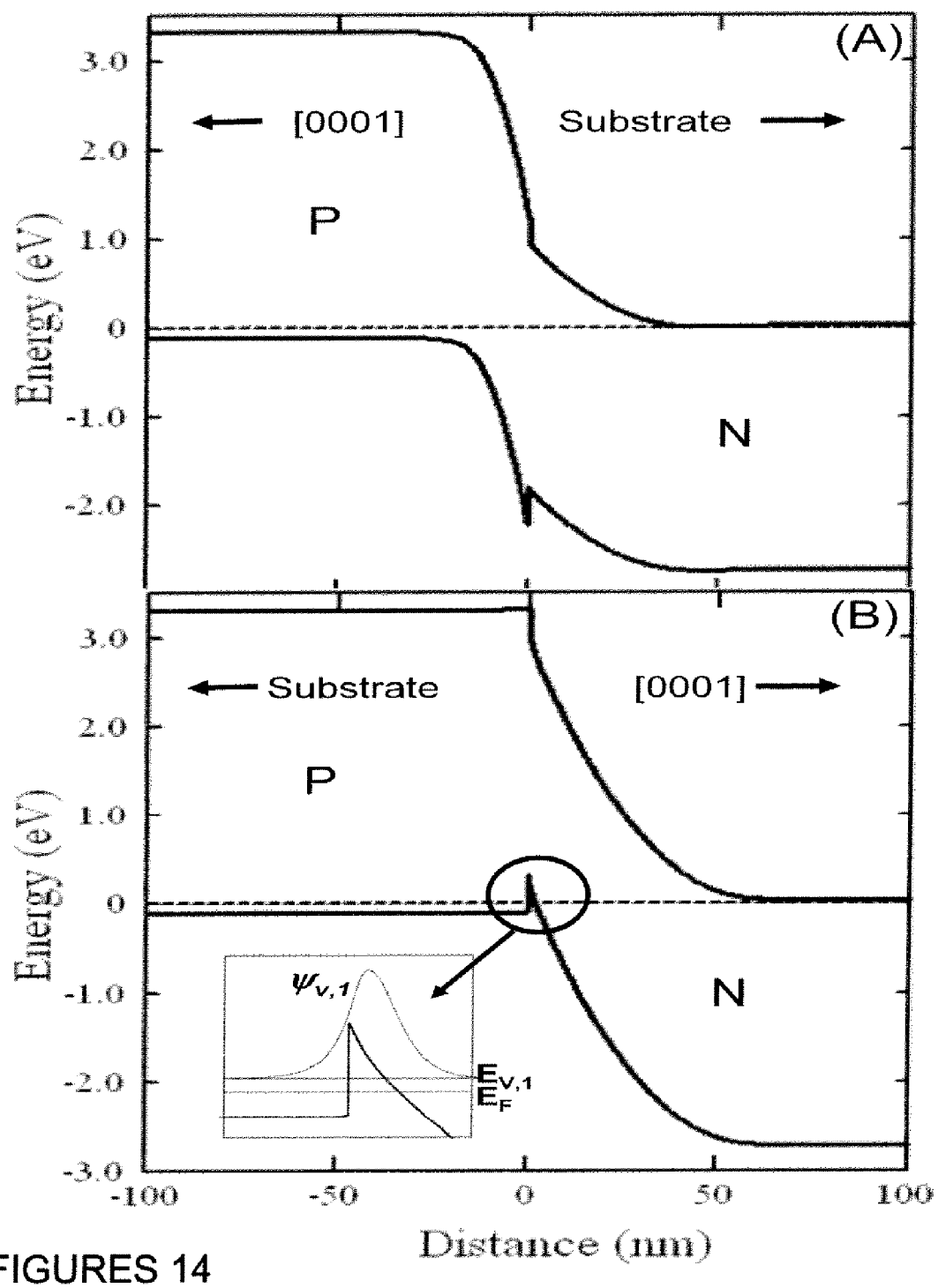
FIGS. 14A and 14B illustrate the simulated band diagrams at zero bias for p-up and p-down structures, respectively.

Displayed in FIG. 14 part A and 14 part B are the simulated band diagrams at zero bias for p-up and p-down structures, respectively. The parameters used in the calculation can be found in the inset in FIG. 14B shows the wave-function of the first confined hole sub-band, its energy and the Fermi energy. The 2D hole gas density calculated is about $1.0\times10^{13}$ e/cm$^2$.

FIGS. 2 and 9 show the band diagrams at a forward current density of 20 A/cm$^2$ for p-up and p-down devices, respectively. Poisson and drift-diffusion current equations with Fermi statistics and thermionic emission at the hetero-junction boundary are solved. The current density and the radiative recombination rate are plotted in FIGS. 2 and 9 for p-up and p-down devices, respectively. In the case of the p-up device, the positive polarization charge results in a substantially smaller effective electron barrier at the n-InGaN/p-GaN interface. This leads to a significant leakage of electrons from the active n-InGaN to the p-GaN layer at room temperature (FIG. 2). About 70% of the electron current overshoots into the p-GaN layer, resulting in a significant recombination within this layer (FIG. 15A). In addition, the injection of holes from the p-GaN to the n-InGaN experiences a potential barrier spike up to several hundred meV, leading to very inefficient injection of holes into the n-InGaN layer (FIG. 2). On the other hand, in the p-down preferred embodiment of the present invention, the negative polarization charge at the interface leads to a substantially reduced barrier for hole injection from the p-GaN to the n-InGaN. Here, electrons encounter a significant barrier for injection from the n-InGaN into the p-GaN, making the p-GaN behave like an effective electron blocking layer (FIG. 9). The formation of the 2DHG in combination with this effective electron-blocking layer significantly enhances the radiative recombination of injected electrons with 2DHG in the n-InGaN active region (FIG. 15B, dotted line).

To understand the recombination of electrons with the 2DHG in the p-down structure, the radiative recombination rate has been calculated the as a function of emitted photon energy (hv) in the publication H. C. Casey, et al., "Device Challenges for Making a p-Side Down HVPE-Grown n-InGaN/p-GaN Single Heterostructure LED., Electrochemical Society Transactions, 11(5) 171-174 (1969) (Casey 1969) hereby incorporated by reference.

Figure 16:
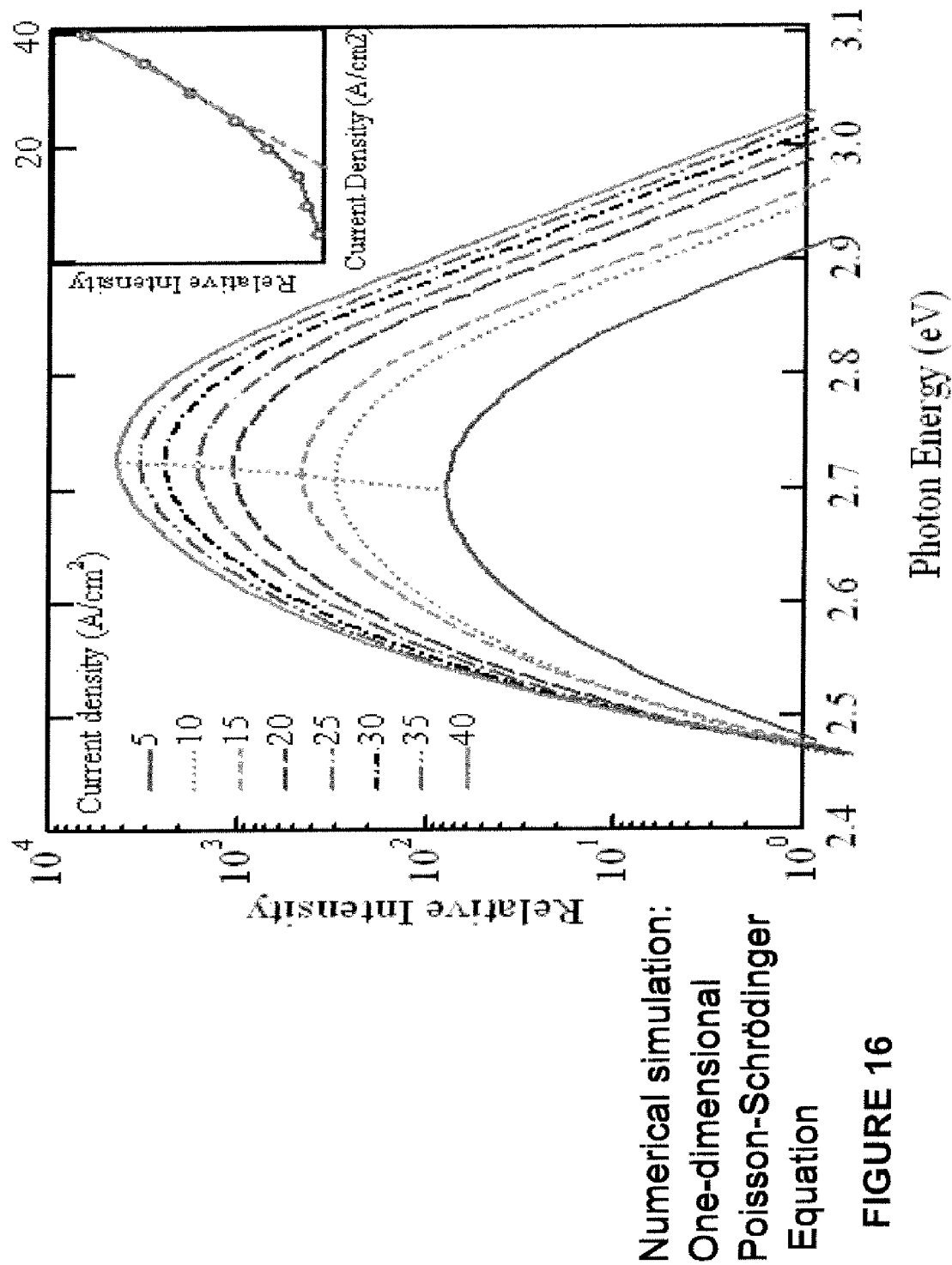
FIG. 16 shows R (radiative recombination rate) as a function of photon energy at various injection current densities.

FIG. 16 shows R as a function of photon energy at various injection current densities. At low injection current density, the peak emission energy shifts to higher energy with a corresponding super-linear increase in light output (FIG. 16, inset) as the injection current increases. At higher injection currents, a linear increase in intensity is reached with slower blue shift in peak energy. Also noted is that the emission intensity at energies lower than the peak energy shows saturation, while the emission intensity at higher energies increases rapidly without saturation. The physics of the shifting-peak spectra is similar to that of photo-assisted tunneling reported in GaAs p-n junctions (Casey, 1969), except that the hole states here are confined. Under forward bias, some of the injected electrons undergo spatially indirect recombination with the 2DHG. With increasing forward bias, the electron quasi-Fermi level increases, leading to more high energy electrons recombining with the 2DHG and a concomitant blue shift of the electroluminescence. This effect, in combination with the improved overlap of electron and hole wave-functions, leads to a superlinear increase in light output.

Figure 17:
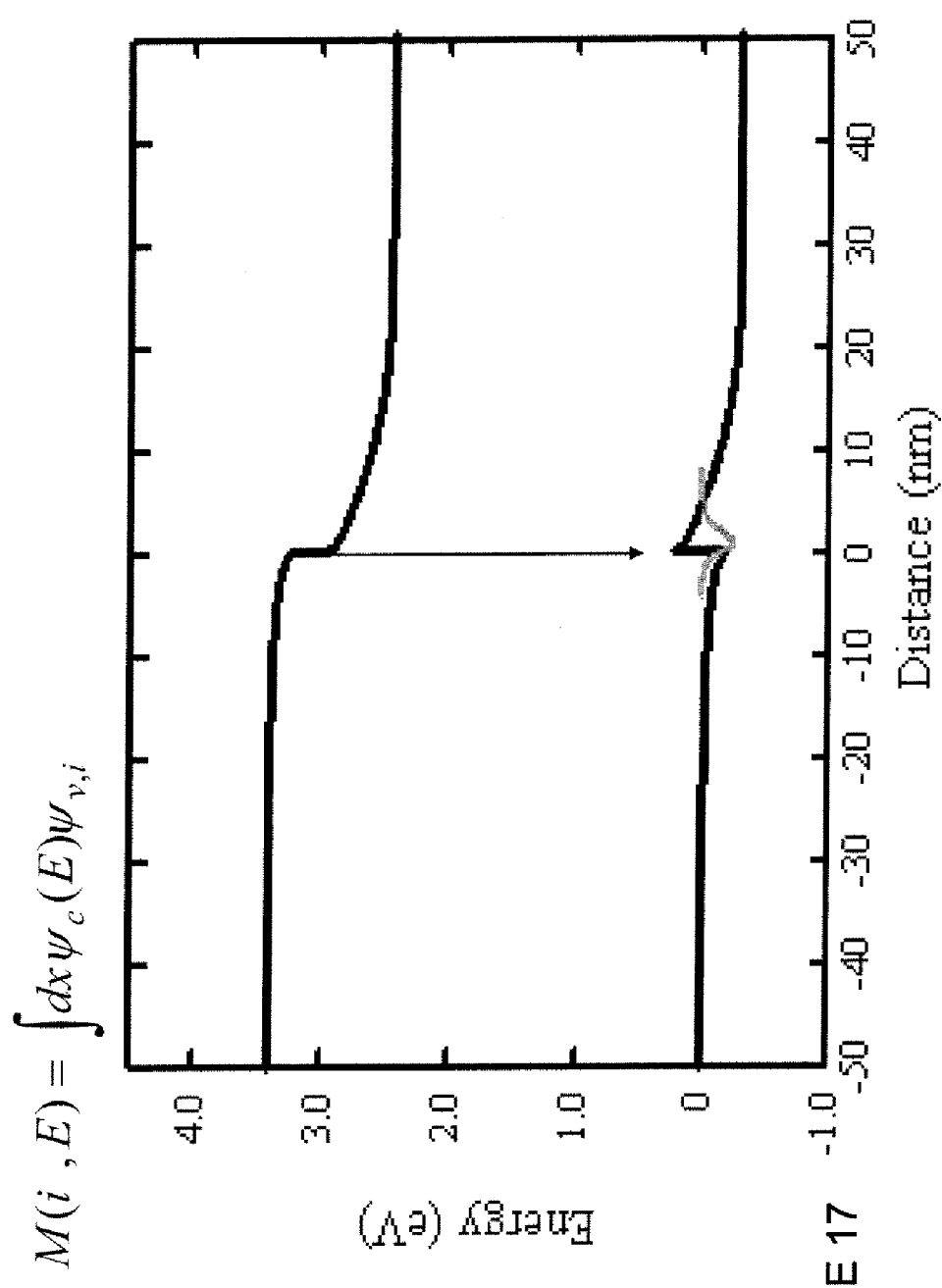
FIG. 17 illustrates the radiative recombination as a function of photon energy at various injection current densities. The inset of FIG. 17 shows light output as a function of injection current density.

FIG. 17 depicts the radiative recombination rate as a function of emitted photon energy. As depicted in FIG. 17, some of the injected electrons undergo spatially indirect recombination with the 2D hole gas. Increasing forward bias results in the electron quasi-Fermi level increasing, more high energy electrons recombining with the 2D hole gas, blue shift of the electroluminescence and superlinear increase in light output.

Figure 18:
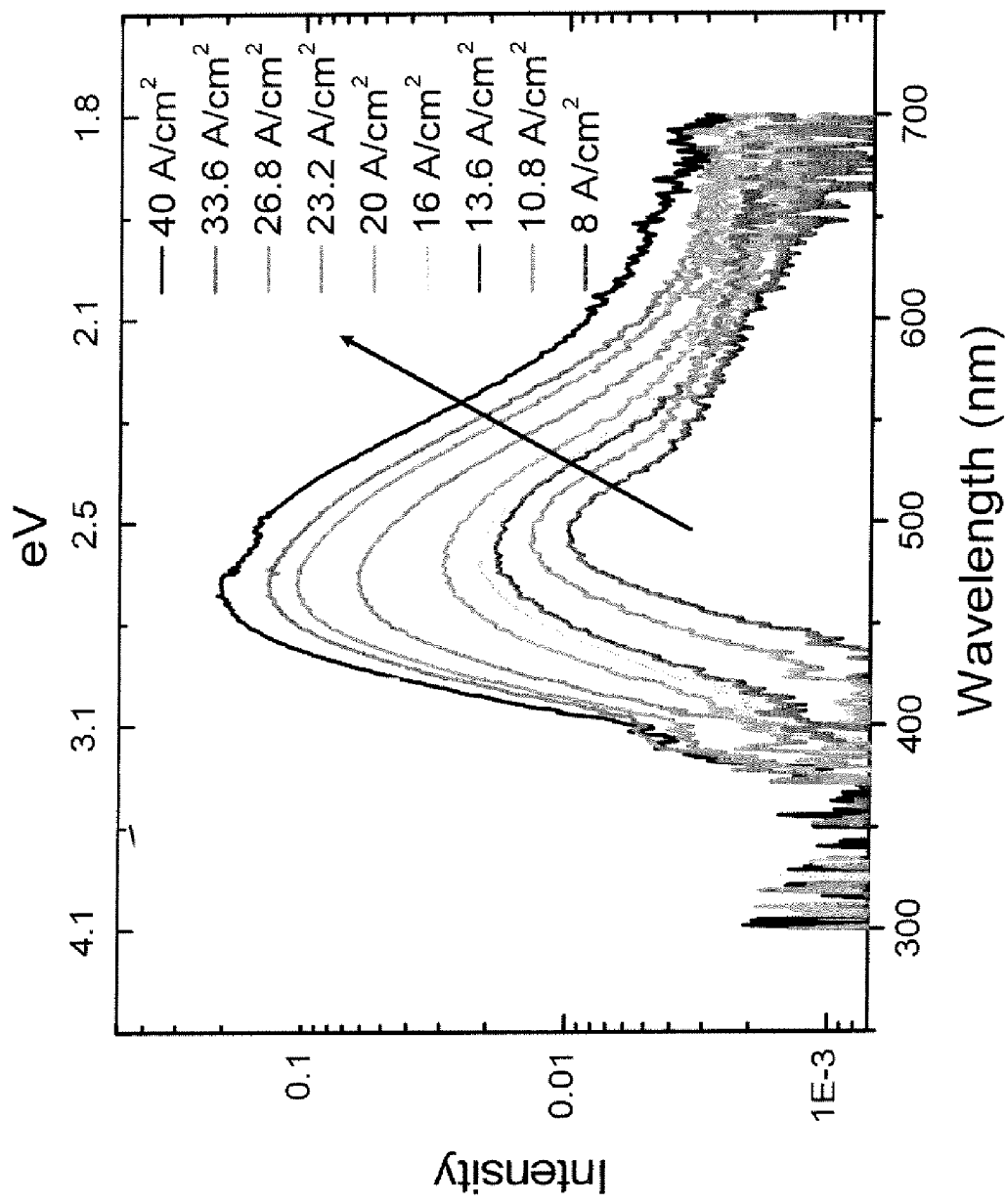
FIG. 18 shows Emission spectra at different currents for an n-InGaN/p-GaN p-down Ga-polar devices.
Figure 19:
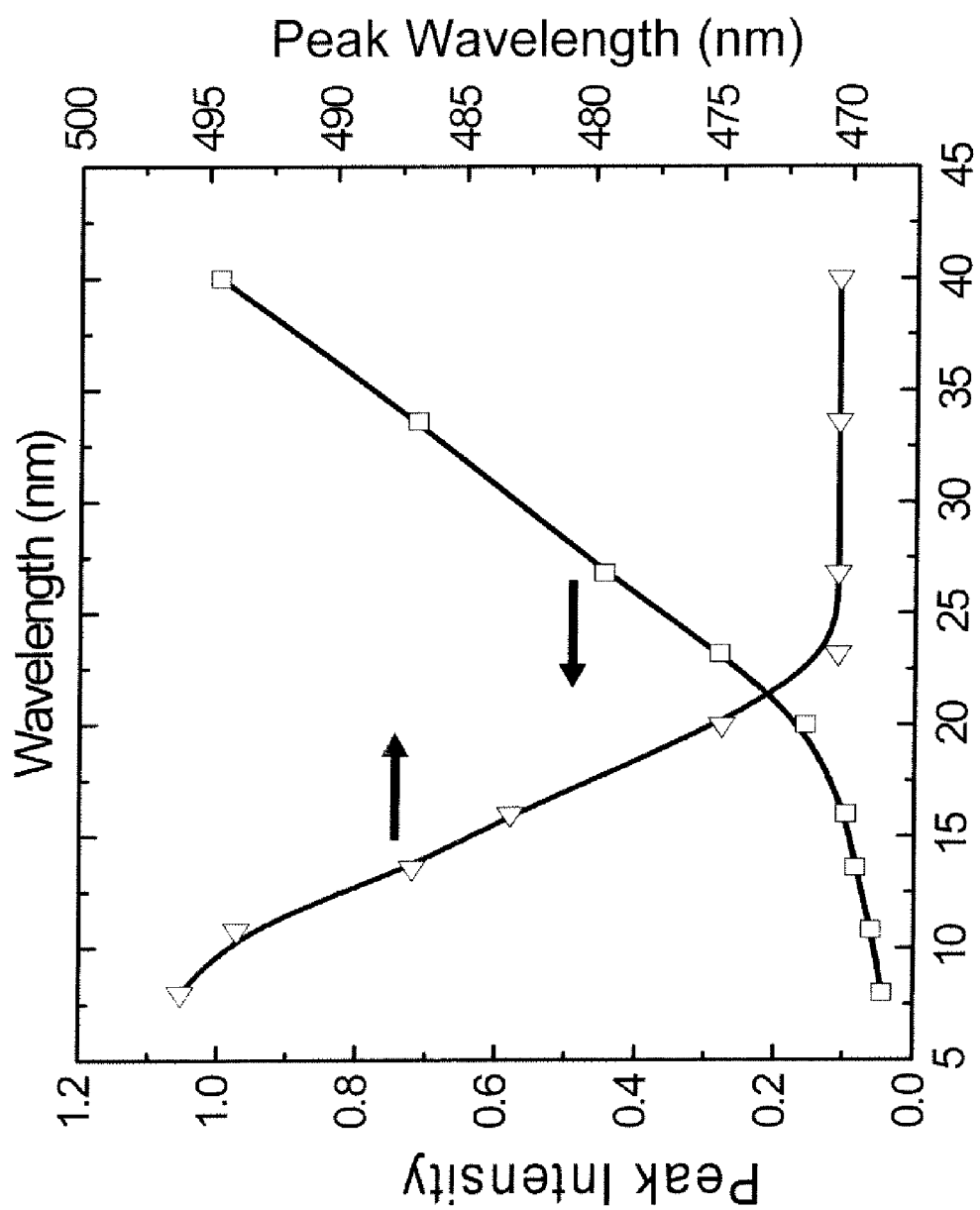
FIG. 19 shows Peak intensity and peak wavelength as a function of current density currents for an n-InGaN/p-GaN p-down Ga-polar devices.

EXPERIMENTAL RESULTS The curves in FIG. 18 represent variances in amperes per centimeter squared. The uppermost curve being 40 amperes per cm$^2$. The lower most curve being 8 amperes per cm$^2$. FIG. 19 shows the radiative recombination as a function of photon energy at various injection current densities for the device shown in FIG. 18. The line containing squares in FIG. 19 is the graphical representation corresponding to the insert shown in FIG. 17, wherein the light output as a function of current intensity is represented. Peak intensity, as represented by the peaks in FIG. 18, is plotted versus the current density. See arrow in FIG. 19 adjacent to the line containing the squares pointing to the peak intensity. At low injection current density, the peak emission energy shifts to higher energy with a corresponding superlinear increase in light output, which indicates an improved overlap of electron and hole wave-functions, leads to enhanced light output at higher current.

Figure 20A:
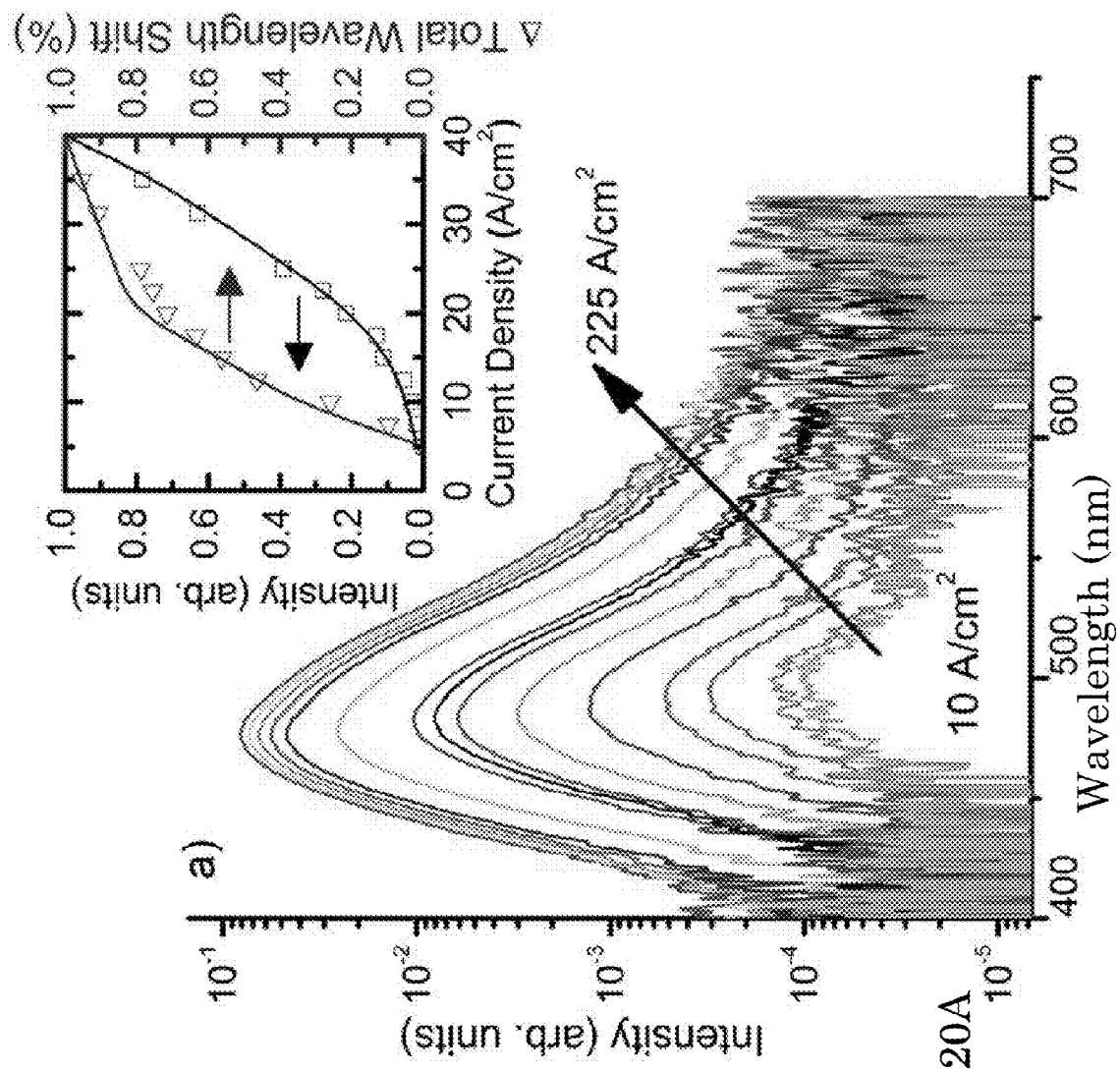
FIG. 20 _(A)_Typical emission spectra at 10% DC current densities for the n-InGaN/p-GaN p-side down, Ga-polar devices having 22% indium composition. The inset compares percent change in total peak wavelength shift and normalized output power at low current density, for both predicted_solid line_and measured device behavior data points. (B) Output power, peak wavelength, and relative EQE as a function of current density for cw, 1% and 10% DCs.
Figure 20:
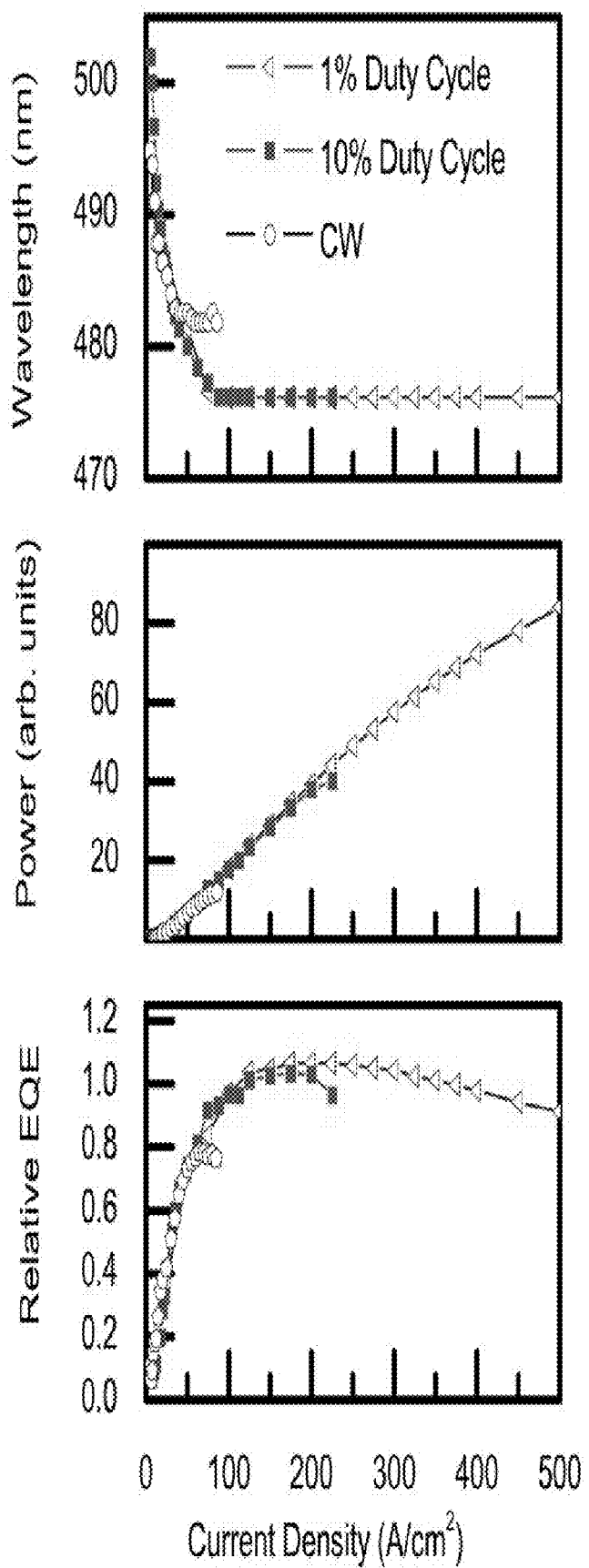

FIG. 20 (A) shows typical emission spectra and output power at 10% duty cycle (DC) current densities for the n-InGaN/p-GaN p-side down, Ga-polar devices having 22% indium composition. At current densities below 25 A/cm$^2$, the peak emission wavelength rapidly shifts from 502 nm to 485 nm with a contemporaneous superlinear increase in light output as the injection current increases. At higher injection current densities a linear increase in power is accompanied by a slower, smaller blue shift to 476 nm by ~85 A/cm$^2$, with no further blue shift in peak wavelength above this current density. The output power, peak wavelength, and relative external quantum efficiency (EQE) as a function of current density under continuous wave (CW), 1% and 10% DC injection are shown in FIG. 20 (B) for a wider range of current densities. The L-I and EQE curves begin to show saturation at higher current densities for lower DC and the CW data exhibits a smaller blue shift in the peak wavelength, demonstrating the impact of heating on the device performance. For 1% DC, the peak EQE is attained above 100 A/cm², with only about 10% droop up to 500 A/cm². Devices of different In content show qualitatively similar behavior.

Insight into these phenomena may be gleaned from comparison of the modeling of p-up and p-down Ga-polar devices at forward current density of 25 A/cm² using a self-consistent solution of the Poisson-Schrodinger equations that includes drift-diffusion currents, Fermi statistics, and thermionic emission at the heterojunction boundary. Accounting for spontaneous and piezoelectric polarizations, the total charge at the InGaN/GaN interface is estimated to be $10^{13}$ e/cm² and negative (positive) for p-down (p-up), Ga-polar structures. Since this negative polarization charge is greater than the maximum positive space charge that the n-InGaN layer can support, in the case of the p-down, Ga-polar device, the negative polarization charge at the interface leads to the formation of a well-confined 2DHG just within the InGaN near the n-InGaN/p-GaN interface, a substantially reduced barrier for hole injection from the p-GaN to the n-InGaN, and a significantly enhanced conduction band heterobarrier that acts as an effective blocking layer for electron transport to the p-GaN (FIG. 9). In contrast, the positive polarization charge at the hetero-interface in the conventional p-up geometry causes a dramatic reduction in the conduction band barrier to electron transport into the p-GaN, as well as a steep (up to several hundred meV) barrier to hole transport into the n-InGaN (FIG. 2)). It could also lead to the formation of a two-dimensional electron gas within the InGaN near the hetero-interface.

The impact of these contrasting band diagrams on electron and hole current densities and radiative recombination rates in these device structures is shown in FIGS. 15A and 15B. For the p-down device, the formation of the 2DHG and reduction in the barrier to hole injection in the n-InGaN, in combination with the effective electron confinement in the same layer due to the higher conduction band hetero-barrier, significantly enhance the radiative recombination of electrons with holes in the n-InGaN active region, as shown in FIG. 15B by the dotted line. The simultaneous rapid blue shift and superlinear increase in electroluminescence observed in FIG. 20 (A) below 25 A/cm² are consistent with radiative tunneling, as described for GaAs p-n junctions. Under forward bias, some of the injected electrons undergo spatially indirect recombination with the 2DHG. With increasing forward bias, the electron quasi-Fermi level increases, leading to more high energy electrons recombining with the 2DHG and a concomitant blue shift of the electroluminescence. This effect, in combination with the improved overlap of electron and hole wave-functions, results in a superlinear increase in light output. The inset of FIG. 20 (A) shows good agreement between modeling and device behavior at low current densities. The more linear increase in intensity accompanied by a slower, smaller blue shift in peak wavelength at higher current density is attributed to a transition to direct recombination, as predicted by our modeling, and residual band filling effects possibly associated with compositional inhomogeneity in the high In content n-InGaN. The low current density behavior, characteristic of the p-down SH device, is distinctly different from band filling in conventional DH LEDs, for which the EL peak is nearly stationary at low injection levels, but exhibits a larger blue shift for high injection. The blue shift is also different from the blue shift in quantum well structures due to the quantum confined Stark effect, in which the majority of the contribution to the blue shift is from the Stark shift of the hole band.

In the case of the conventional p-up Ga-polar structure, the substantially smaller effective electron barrier at the n-InGaN/p-GaN interface leads to a significant leakage of electrons from the active n-InGaN to the p-GaN layer, resulting in recombination within the p-GaN layer, as shown in FIG. 16 (A), and characteristic blue emission from fabricated devices (not shown). In addition, the high potential barrier to hole injection into the n-InGaN leads to very inefficient injection of holes into the n-InGaN layer. The first practical devices showed that these issues are partially remedied through insertion of a wider bandgap AlGaN electron blocking layer at the hetero-interface that aids electron confinement in the active region in conventional InGaN/GaN MQW and DH LEDs.

The EQE of the p-down SH n-InGaN/p-GaN LED under 1% DC current injection peaks above 100 A/cm², well beyond the current density (~10 to 25 A/cm²) at which conventional p-up, Ga-polar InGaN/GaN MQW LEDs already exhibit significant efficiency droop. It has been suggested that the peak efficiency at low current density in conventional InGaN/GaN MQW LEDs is strongly dependent upon electron leakage from the active region and device defect density, while the drop in efficiency at high current density has been attributed to Auger recombination resulting from the high QW carrier density, although electron leakage may still play a role. While the efficiency at low current density in our p-down SH LED is limited by its tunneling behavior, the efficiency at high current density should strongly depend on the effective width for radiative recombination within the triangular potential that confines the 2DHG. Since the electron wave function is not confined, for comparison purposes this effective width can be defined as that of an equivalent InGaN/GaN quantum well with a similar hole wave function as that in our LED under forward bias. This width is ~12 nm, suggesting that our EQE should peak at higher current densities because of the reduced carrier density in this active region. A 430 nm DH LED with similar active region width (13 nm) has been reported to have peak external quantum efficiency at current density beyond 200 A/cm². The lack of significant efficiency droop in our p-down SH LED at 1% DC current densities as high as 500 A/cm² without need of the AlGaN electron blocking layer or the second heterojunction to ensure hole confinement required in conventional p-up Ga-polar DH LEDs shows promise for simplified LED structures with lower manufacturing costs.

In accordance with the present invention, the peak intensity line rises approximately linearly at significantly higher current densities. Thus, in addition to low wall plug efficiency, the prior art devices usually exhibit further external quantum efficiency droop at high injection currents (20 A/cm².), which are attributed to large electron overshoot at high injection currents resulting from the positive polarization charge near the p-cladding layer in conventional p-up Ga-polar devices. To reduce electron overshoot, an electron-blocking layer with a larger band gap must be used. The large band gap electron blocking layer, however, increases the polarization field in the quantum well, thereby only partly ameliorating the electron leakage, while creating a potential spike in the valence band that blocks the injection of holes. Recent research shows that the efficiency droop may relate to the strong Auger recombination in the QW and suggests that single or double heterojunction LEDs may be beneficial in achieving higher efficiency at high injection currents. In accordance with the present invention, both modeling and experimental results on single heterojunction light emitting devices demonstrate that the negative polarization charge is beneficial by properly engineering the device layers. The benefit of such device is the suppression of electron overshoot in combination with enhanced hole injection.

FIG. 21 (A) shows the output power and peak wavelength as a function of current density for an 8% InN device; FIG. 21 (B) shows the emission spectra for the same 8% InN device. The emission wavelength decreases from 486 nm to 483 nm as the current density is increased from 4 A/cm² to 12 A/cm². In our previous work analysis reveals a two-dimensional hole gas (2DHG) confined in the InGaN layer near the GaN/InGaN interface. As forward bias is increased, the electron quasi-Fermi energy increases leading to the recombination of a greater number of higher energy electrons with the 2DHG resulting in a rapid wavelength blue shift; simultaneously there is increasing overlap of the electron and hole wave functions that leads to the superlinear increase in emission intensity up to 12 A/cm². Above 12 A/cm², the device transitions from indirect radiative tunneling to direct recombination; further increases in current density yield only linear increases in emission intensity and no further shifts in emission wavelength.

Similar behavior is observed for the 17% InN device as seen in FIGS. 21 (C) and 21(D). The peak emission wavelength shifts from 495 nm to 470 nm with a simultaneous superlinear increase in light output as the current density increases from 8-20 A/cm². At higher injection currents a linear increase in intensity is observed with no further blue shift in peak wavelength. These behaviors are in general agreement with our modeling as discussed above.

Figure 21A:
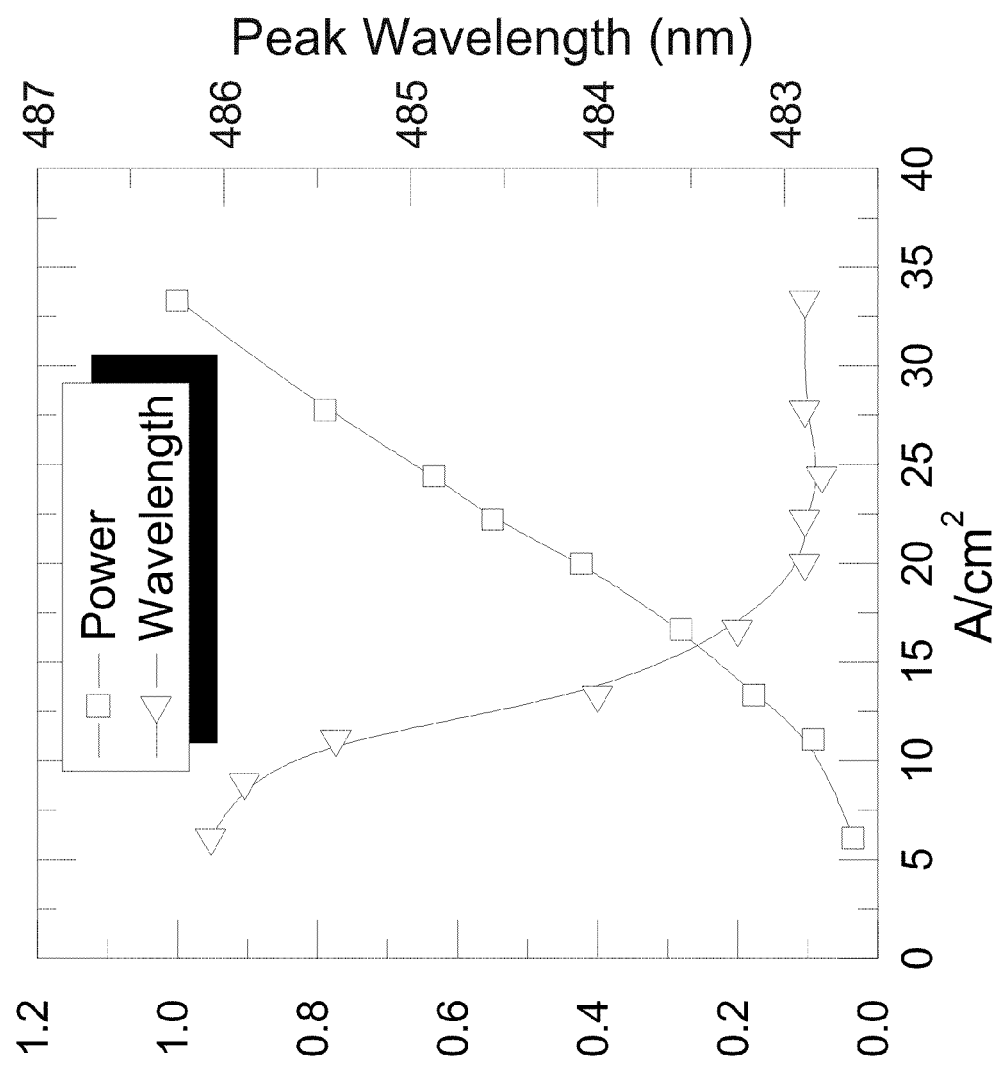
FIG. 21. Shows the output power and peak emission wavelength blue shift as a function of current density for LEDs having an indium composition of (A) 22%, (C) 17% and (E) 8%. The corresponding spectra for each device are shown in (B), (D) and (F) respectively.
Figure 21B:
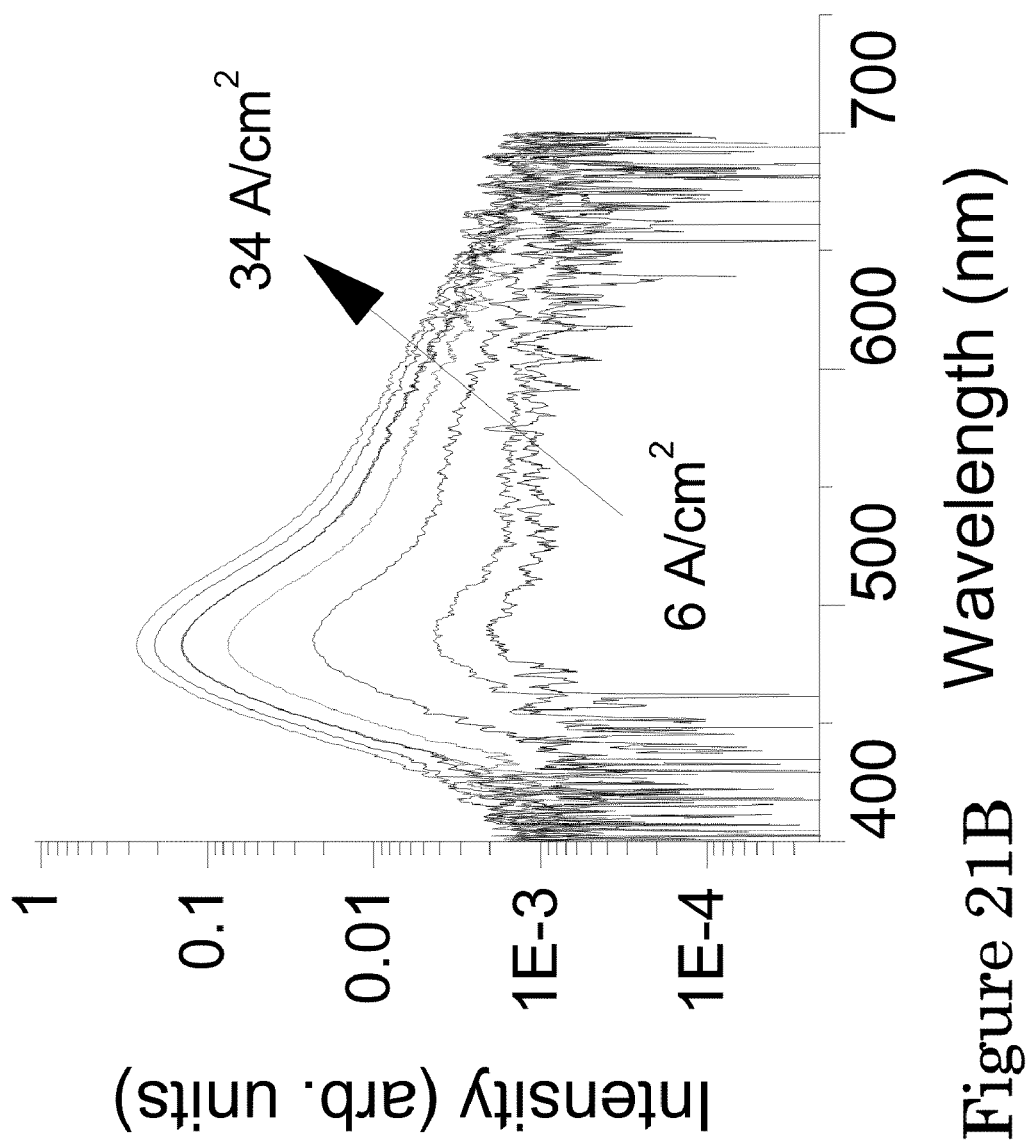
Figure 21C:
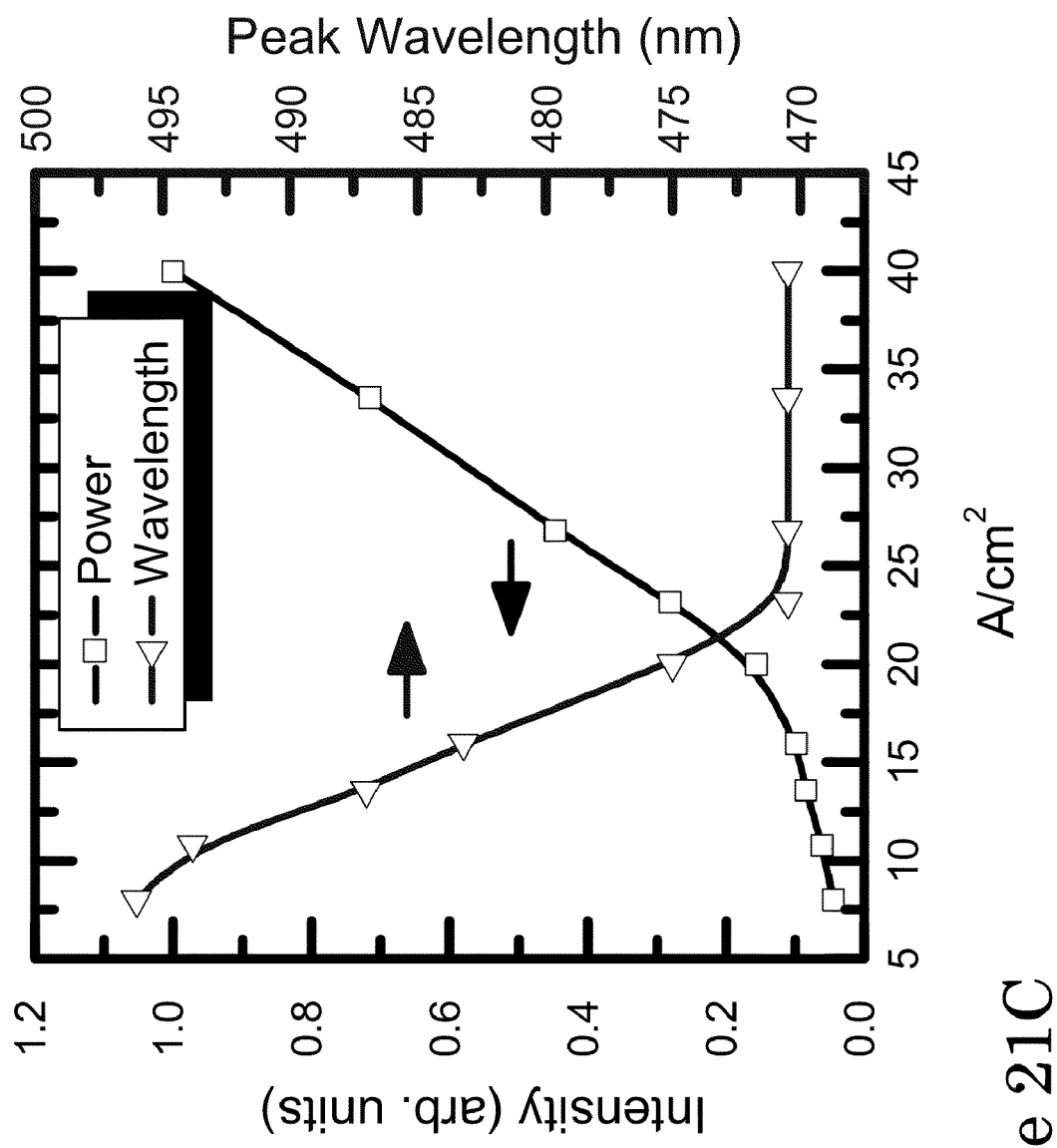
Figure 21D:
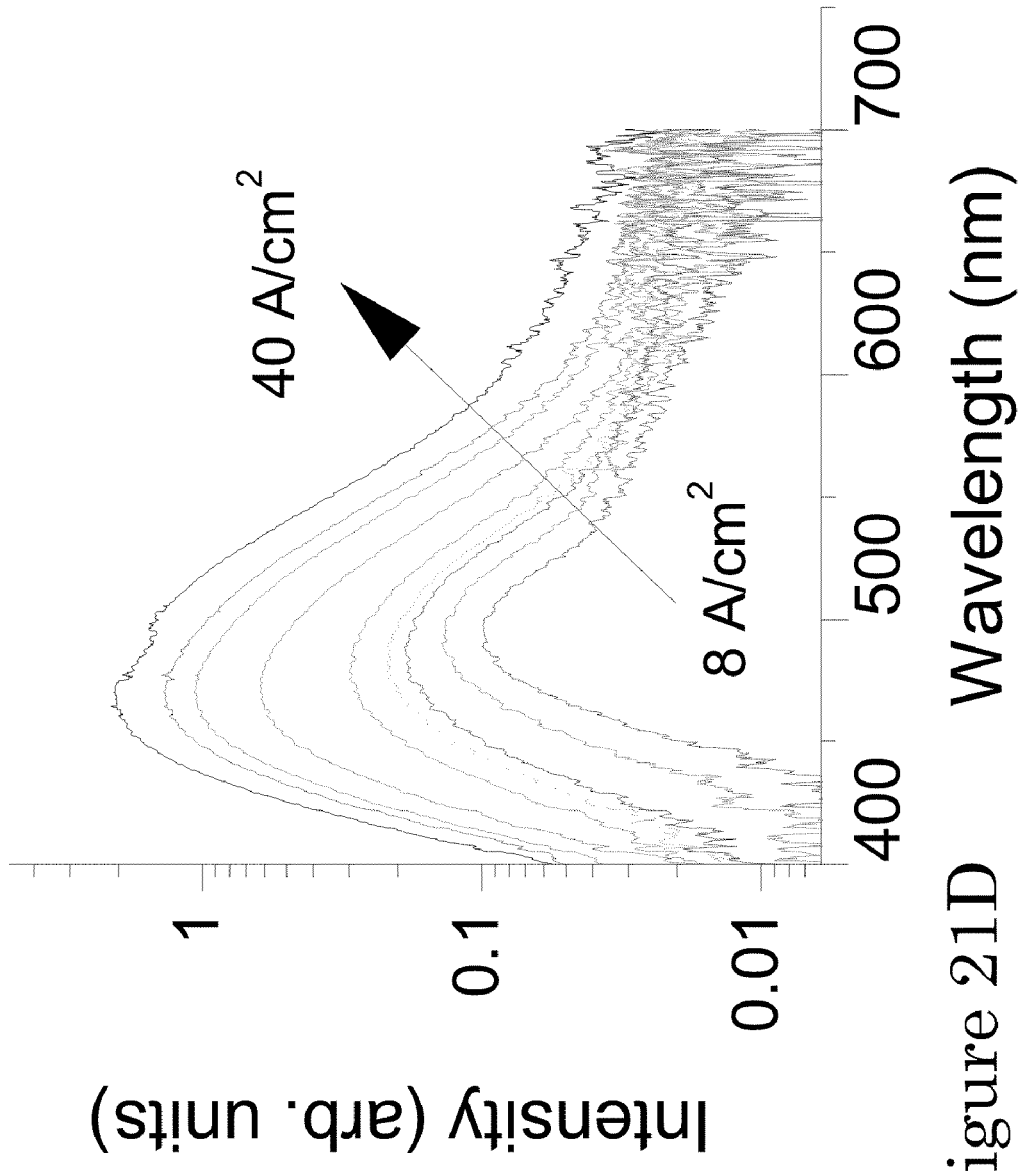
Figure 21E:
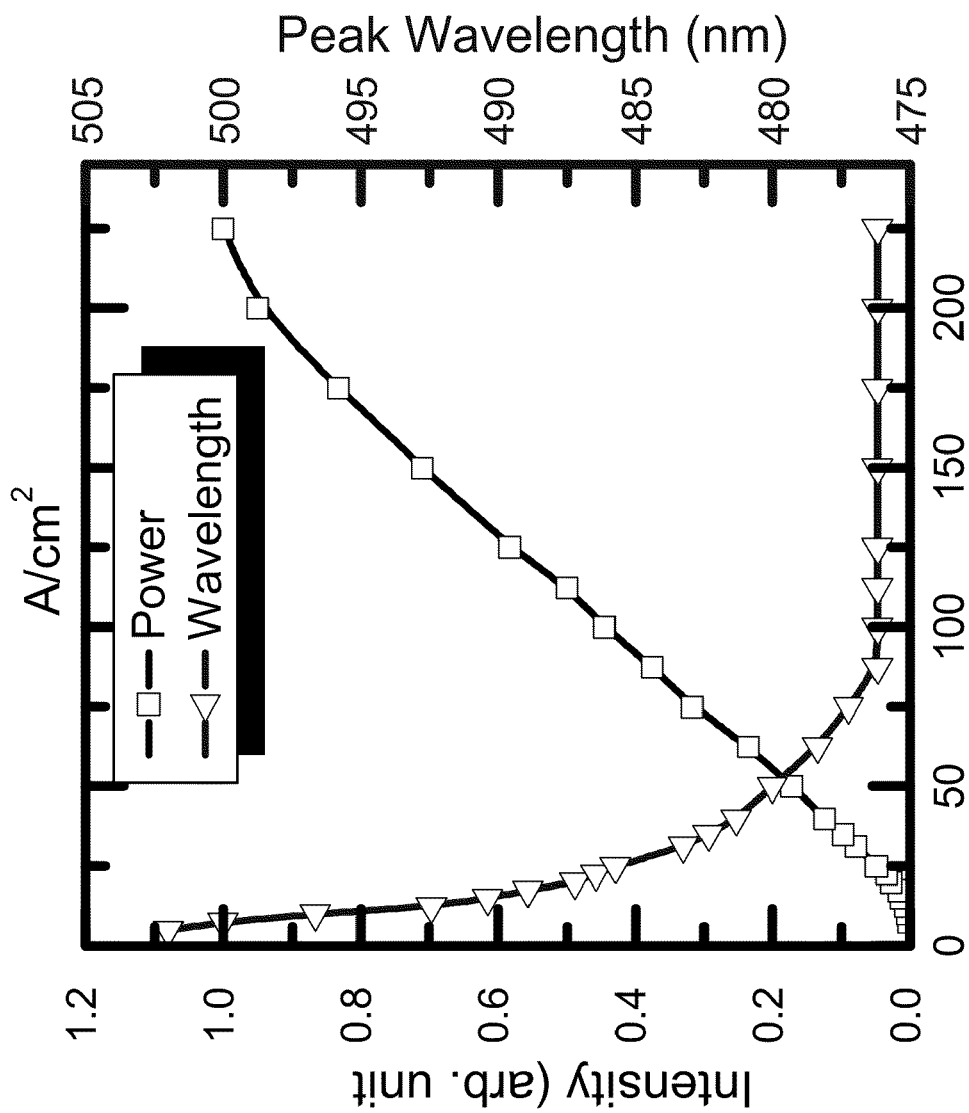
Figure 21F:
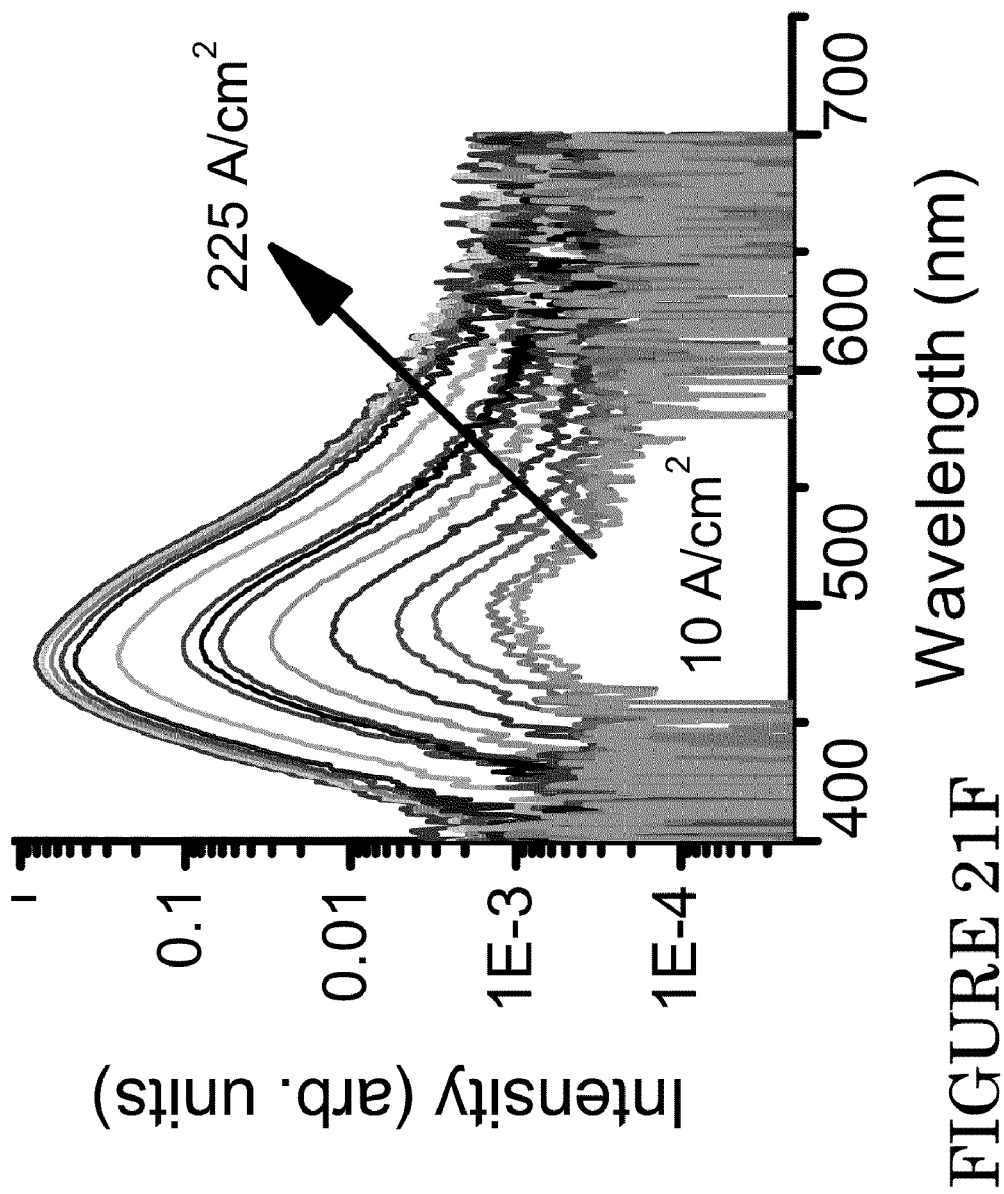

The optical behavior of the 22% InN device shown in FIGS. 21(E) and 21(F) departs slightly from the lower indium content films described above. Although the same emission intensity trend is observed with increasing forward bias, i.e. a superlinear increase in intensity followed by a linear intensity increase, the wavelength blue shift of the 22% InN film continues beyond the indirect to direct transition. At higher injection current densities the linear increase in power is accompanied by a slower, smaller blue shift to 476 nm by ~85 A/cm², with no further blue shift in peak wavelength above this current density. This continued blue shift is not observed in the lower indium content films and is an indication of band filling within the 22% InN film.

SH n-InGaN/p-GaN p-side down LED devices containing less than 20% InN exhibit a superlinear increase in emission intensity accompanied by rapid blue shift in peak wavelength as injection current is increased due to a transition from indirect radiative tunneling to direct radiative recombination. Further increases in current yield a linear increase in emission intensity with no shift in peak wavelength. However, devices with greater than 20% InN continue to exhibit a more gradual blue shift well beyond the indirect to direct transition. This behavior is an indication of band filling which may be associated with compositional inhomogeneities within the InGaN film.

The single heterojunction n-$In_{0.13}Ga_{0.87}N$/p-GaN was grown on an n-GaN template by hydride vapor phase epitaxy (HVPE) on a sapphire substrate. HVPE was preferred because it has higher growth rates (up to 100 μm) than MOCVD and MBE. Buffer layers were not required for growth of high quality, low defect density GaN. In the preferred embodiment of FIG. 22A, p-GaN template is grown by HVPE with ~1×10¹⁹/cm³ carrier concentration (doping concentration). As an example, the preferred embodiment of FIG. 22A which consists of a substrate 1, a template 2, a p-GaN layer 10, a n-InGaN layer 9, with a p-contact layer 12 and a n-contact layer 11, may be produced using standard photolithography ICP/RIE to define MESA depth of 0.5 μm with E-beam evaporation of p-contact Ni/Au; 200 Å/1000 Å; RTA at 650° C. for 2 min in $N_2$; RF sputtering of n-contact; ITO 1500 Å. Device area consists of 100 μm, 200 μm and 300 μm square devices.

Figure 23:
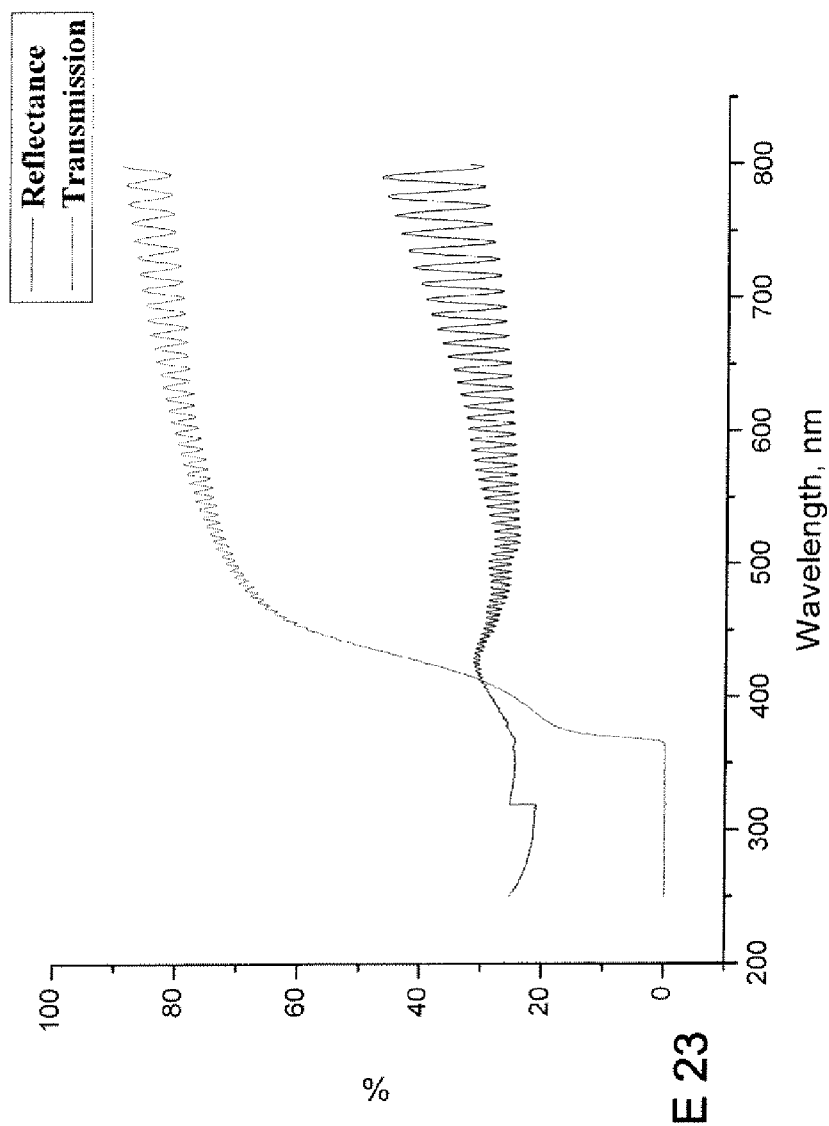
FIG. 23 is a graphical illustration of transmission and reflectance data of n-InGaN/p-GaN single heterojunction (p-GaN down) of FIG. 22. The transmission and reflectance measurements taken using Perkin Elmer Lambda 19 UV/VIS/IR spectrometer system. The band gap measured to be ~2.72 eV (455 nm) which corresponds to indium composition of ~17%.

Reflectivity and transmission measurements were performed using a Perkin Elmer Lambda 19 UV/VIS/IR spectrometer system on both the SH and the ITO. Based on these measurements the band-edge for the InGaN is ~421 nm (2.94 eV). FIG. 23 is a graphical illustration of transmission and reflectance data of n-InGaN/p-GaN single heterojunction (p-GaN down) of FIG. 22. The transmission and reflectance measurements taken using Perkin Elmer Lambda 19 UV/VIS/IR spectrometer system. The band gap measured to be ~2.72 eV (455 nm) which corresponds to indium composition of ~17%.

In accordance with a preferred embodiment of the present invention, peak intensity line rises approximately linearly after a current density of approximately 24 amperes per centimeter squared. This is shown in FIG. 21 as the linear part of the line containing squares. The corresponding line for conventional devices, not shown, would reveal an "efficient droop" at around 20-30, i.e., the intensity would go down after around 20-30 amperes per centimeter squared for conventional device. For the a preferred embodiment of the present invention, the peak intensity it does not go down in at least up to 40, which represents a dramatic improvement in performance results. Thus, in addition to low wall plug efficiency, the prior art devices usually exhibit further external quantum efficiency droop at high injection currents (20 A/cm²), which are attributed to large electron overshoot at high injection currents resulting from the positive polarization charge near the p-cladding layer in conventional p-up Ga-polar devices. To reduce electron overshoot, an electron-blocking layer with a larger band gap must be used. The large band gap electron-blocking layer, however, increases the polarization field in the quantum well, thereby only partly ameliorating the electron leakage, while creating a potential spike in the valence band that blocks the injection of holes. Recent research shows that the efficiency droop may relate to the strong Auger recombination in the QW and suggests that single or double heterojunction LEDs may be beneficial in achieving higher efficiency at high injection currents. In accordance with the present invention, both modeling and experimental results on single heterojunction LEDs demonstrate that the negative polarization charge is beneficial by properly engineering the device layers. The benefit of such device is the suppression of electron overshoot in combination with enhanced hole injection. Experimental results, as shown in FIG. 21, show no efficiency droop with the present invention at continuous injection current densities up to 40 Amperes per centimeter squared. Using the principles of the present invention result in improved performance of LEDs, which have many DOD and civilian applications including ultraviolet light devices.

The terminology "polarization vector" as used herein means the polarization has both a magnitude and direction. In classical electromagnetism, the polarization density (or electric polarization, or simply polarization) is the vector field that expresses the density of permanent or induced electric dipole moments in a dielectric material. The polarization vector P is defined as the dipole moment per unit volume. The SI unit of measure is coulombs per square meter. It should be emphasized that the above-described embodiments are merely possible examples of implementations. Many variations and modifications may be made to the above-described embodiments. All such modifications and variations are intended to be included herein within the scope of the disclosure and protected by the following claims. The term "processor" or "computer" as used herein includes multiprocessors, computers, supercomputers, data processor, laptops, signal processors, personal computers, notebook computers, and/or any component which processes data.

Obviously, many modifications and variations of the present invention are possible in light of the above teachings.

The invention claimed is:

1. A light emitting device comprising:
a polar template;
a p-type layer grown on the polar template; the p-type layer having a first polarization vector; the first polarization vector having a first projection relative to a growth direction;
an n-type layer grown on the p-type layer; the n-type layer having a second polarization vector; the second polarization vector having a second projection relative to said growth direction that is larger than the first projection of the first polarization vector for the p-type layer; the n-type layer and p-type layer forming an interface;
whereby the first polarization vector in the p-type layer and second polarization vector in the n-type layer create a discontinuity at the interface resulting in a negative charge appearing at the interface.

2. The device of claim 1, wherein when the n-type layer is deposited on the p-type layer a potential barrier is formed at the interface and wherein the negative charge results in an enhancement of the potential barrier at the interface of the p-type layer and the n-type layer such that electron transport from the n-type layer to the p-type layer is suppressed.

3. The device of claim of 1 wherein when the n-type layer is deposited on top of the p-type layer a depletion charge is formed in a depletion region, the n-type layer having a doping level such that the depletion charge is less than the polarization charge at the interface to thereby form a 2D hole gas in the n-type layer near the interface, whereby the 2D hole gas significantly enhances the radiative recombination of injected electrons with 2D hole gas in the n-type layer.

4. The device of claim 3 wherein the dopant concentration in the n-type layer is determined by the formula:

$$N_D < \frac{q\sigma^2}{2\Delta E_g \varepsilon_0}$$

where $N_D$ is the doping density, q is the electron charge ($1.6 \times 10^{-19}$; coulombs); $\sigma$ is the spontaneous and piezoelectric polarization charge density, $\Delta E_g$ is the band gap difference between n- and p-layers, and $\varepsilon_0$ is the dielectric constant of the n-type material.

5. The device of claim 1 wherein the polar template is a Group II or Group III polar template and wherein the direction of the first polarization vector forms an obtuse angle with the growth direction or is antiparallel with the growth direction and the projection of second polarization vector to the growth direction is larger than the projection of the first polarization vector to the growth direction.

6. The device of claim 5 wherein Group II or Group II template is Galium polar Galium Nitride template and the p-type layer is Gallium Nitride and the n-type layer is $In_xGa_{1-x}N$ where 0<x<1.

7. The device of claim 1 wherein the polar template is a Group V or Group VI polar template and wherein the directions of the first and second polarization vectors each form an acute angle with the growth direction or are parallel with the growth direction and the magnitude of the first polarization vector is smaller than the magnitude of the second polarization vector.

8. The device of claim 7 wherein Group V or Group VI template is [10-1-1] semi-polar Gallium Nitride template and the p-type layer is Gallium Nitride and the n-type layer is $In_xGa_{1-x}N$ where 0<x<1.

9. A light emitting device comprising:
a polar template;
a n-type layer grown on the template; the n-type layer having a first polarization vector; the first polarization vector having a first projection relative to a growth direction;
an p-type layer grown on the n-type layer; the p-type layer having a second polarization vector; the second polarization vector having a second projection relative to said growth direction that is larger than the first projection of the first polarization vector for the p-type layer; the n-type layer and p-type layer forming an interface;
whereby the first polarization vector in the p-type layer and second polarization vector in the n-type layer create a discontinuity at the interface resulting in a negative charge appearing at the interface.

10. The device of claim 9, wherein when the p-type layer is deposited on the n-type layer a potential barrier is formed at the interface and wherein the negative charge results in an enhancement of the potential barrier at the interface of the p-type layer and the n-type layer such that electron transport from the n-type layer to the p-type layer is suppressed.

11. The device of claim 9 wherein when the p-type layer is deposited on top of the n-type layer a depletion charge is formed in a depletion region, the n-type layer having a doping level such that the depletion charge is less than the polarization charge at the interface to thereby form a 2D hole gas in the n-type layer near the interface, whereby the 2D hole gas significantly enhances the radiative recombination of injected electrons with 2D hole gas in the n-type layer.

12. The device of claim 11 wherein the dopant concentration in the n-type layer is determined by the formula:

$$N_D < \frac{q\sigma^2}{2\Delta E_g \varepsilon_0}$$

where $N_D$ is the doping density, q is the electron charge ($1.6 \times 10^{-19}$; coulombs); $\sigma$ is the spontaneous and piezoelectric polarization charge density, $\Delta E_g$ is the band gap difference between n- and p-layers, and $\varepsilon_0$ is the dielectric constant of the n-type material.

13. The device of claim 9 wherein the polar template is a Group V or Group VI polar template and wherein the direction of the second polarization vector forms an acute angle with the growth direction or is parallel with the growth direction and the projection of second polarization vector to the growth direction is larger than the projection of the first polarization vector to the growth direction.

14. The device of claim 13 wherein Group V or Group VI template is Nitrogen polar Galium Nitride template and the p-type layer is Gallium Nitride and the n-type layer is $In_xGa_{1-x}N$ where 0<x<1.

15. The device of claim 9 wherein the polar template is a Group II or Group III polar template and wherein the direction of the first polarization vector forms an obtuse angle with the growth direction or is antiparallel with the growth direction and the projection of second polarization vector to the growth direction is larger than the projection of the first polarization vector to the growth direction.

16. The device of claim 15 wherein Group II or Group III template is [11-22] semi-polar Galium Nitride template and the p-type layer is Gallium Nitride and the n-type layer is $In_xGa_{1-x}N$ where $0<x<1$.

17. The device of claim 1 wherein the n-type layer comprises first and second n-layers, the first n-layer being of smaller bandgap than the second n-layer forming a double heterostructure.

18. The device of claim 1, wherein the p-type layer or n-type layer comprises, GaN, GaInN, AlGaN, AlN, InN or alloys thereof, or ZnO, MnO, AlSb, AlAs, AlP, BN, BP, BAs, GaSb, GaP, InSb, InAs, InP, CdSe, CdS, CdTe, ZnSe, ZnS, ZnTe or alloys thereof.

19. The device of claim 9, wherein the p-type layer or n-type layer comprises GaN, GaInN, AlGaN, AlN, InN or alloys thereof, or ZnO, MnO, AlSb, AlAs, AlP, BN, BP, BAs, GaSb, GaP, InSb, InAs, InP, CdSe, CdS, CdTe, ZnSe, ZnS, ZnTe or alloys thereof.

20. The device of claim 1 wherein the polar template is Al-polar AlN, N-polar AlN, Al-polar $Al_xGa_{1-x}N$ for $0<x<1$, N-polar $Al_xGa_{1-x}N$ for $0<x<1$, Ga-polar GaN, N-polar GaN, Ga-polar $In_xGa_{1-x}N$ for $0<x<1$, N-polar $In_xGa_{1-x}N$ for $0<x<1$, In-polar InN, N-polar InN, Al-polar AlSb, Sb-polar AlSb, Al-polar AlAs, As-polar AlAs, Al-polar AlP, P-polar AlP, B-polar BN, N-polar BN, B-polar BP, P-polar BP, B-polar BAs, As-polar BAs, Ga-polar GaAs, As-polar GaAs, Ga-polar GaSb, Sb-polar GaSb, Ga-polar GaP, P-polar GaP, In-polar InSb, Sb-polar InSb, In-polar InAs, As-polar InAs, In-polar InP, P-polar InP, or alloys thereof, Zn-polar ZnO, O-polar ZnO, Mn-polar MnO, O-polar MnO, Cd-polar CdSe, Se-polar CdSe, Cd-polar CdS, S-polar CdS, Cd-polar CdTe, Te-polar CdTe, Zn-polar ZnSe, Se-polar ZnSe, Zn-polar ZnS, S-polar ZnS, Zn-polar ZnTe, Te-polar ZnTe, or alloys thereof.

21. A light emitting device comprising:
a Group III polar template;
a p-type layer grown on the template; the p-type layer having a first polarization vector;
an n-type layer grown on the p-type layer; the n-type layer having a second polarization vector; the n-type layer and p-type layer forming an interface;
the p-type layer having a wider bandgap than the n-type layer; the magnitude of the polarization vector in the p-type layer being larger than the magnitude of the polarization vector in the n-type layer resulting in a discontinuity at the interface creating a negative charge at the interface.

* * * * *